(12) United States Patent
Iwashina et al.

(10) Patent No.: US 12,727,270 B2
(45) Date of Patent: Sep. 1, 2026

(54) PHOTODETECTION DEVICE, SEMICONDUCTOR PHOTODETECTION ELEMENT, AND METHOD FOR DRIVING SEMICONDUCTOR PHOTODETECTION ELEMENT

(71) Applicant: HAMAMATSU PHOTONICS K.K., Hamamatsu (JP)

(72) Inventors: Shinya Iwashina, Hamamatsu (JP); Shunsuke Adachi, Hamamatsu (JP); Shigeyuki Nakamura, Hamamatsu (JP); Terumasa Nagano, Hamamatsu (JP); Ryutaro Tsuchiya, Hamamatsu (JP)

(73) Assignee: HAMAMATSU PHOTONICS K.K., Shizuoka (JP)

( * ) Notice: Subject to any disclaimer, the term of this patent is extended or adjusted under 35 U.S.C. 154(b) by 0 days.

(21) Appl. No.: 19/095,278

(22) Filed: Mar. 31, 2025

(65) Prior Publication Data

US 2025/0234662 A1 Jul. 17, 2025

Related U.S. Application Data

(63) Continuation of application No. 18/668,750, filed on May 20, 2024, now Pat. No. 12,324,263, which is a (Continued)

(30) Foreign Application Priority Data

Jul. 18, 2018 (JP) ................................ 2018-135253

(51) Int. Cl.
*H10F 39/00* (2025.01)
*G01S 7/497* (2006.01)
(Continued)

(52) U.S. Cl.
CPC ....... *H10F 39/8057* (2025.01); *H04N 25/766* (2023.01); *H10F 39/024* (2025.01);
(Continued)

(58) Field of Classification Search
CPC .... H10F 39/8057; H10F 39/807; H10F 39/18; H10F 39/024; H10F 39/811; H10F 30/225; H04N 25/766
(Continued)

(56) References Cited

U.S. PATENT DOCUMENTS

| | | | |
|---|---|---|---|
| 9,864,074 | B1 | 1/2018 | Newman |
| 10,658,415 | B2 | 5/2020 | Ishida et al. |

(Continued)

FOREIGN PATENT DOCUMENTS

| | | | |
|---|---|---|---|
| CN | 1836331 | A | 9/2006 |
| CN | 101105531 | A | 1/2008 |

(Continued)

OTHER PUBLICATIONS

International Preliminary Report on Patentability mailed Jan. 28, 2021 for PCT/JP2019/022609.

(Continued)

*Primary Examiner* — Joel W Fosselman
(74) *Attorney, Agent, or Firm* — FAEGRE DRINKER BIDDLE & REATH LLP

(57) ABSTRACT

Each of a plurality of cells includes at least one avalanche photodiode. A light projecting unit is arranged to project light having a cross-sectional shape whose longitudinal direction corresponds to a first direction. The light projecting unit is arranged to scan the light along a second direction intersecting the first direction such that the reflected light is incident on, among N cell groups each of which includes M cells aligned in a row direction, each cell group or each plurality of cell groups. A controller is arranged to apply, in
(Continued)

accordance with the incidence of the reflected light, a bias voltage that makes the avalanche photodiode operate in a Geiger mode to each cell group or each plurality of cell groups, and is arranged to read signals from cells included in the cell group or the plurality of cell groups to which the bias voltage has been applied.

36 Claims, 18 Drawing Sheets

Related U.S. Application Data continuation of application No. 17/258,947, filed as application No. PCT/JP2019/022609 on Jun. 6, 2019, now Pat. No. 12,021,100.

(51) Int. Cl.
*G01S 17/89* (2020.01)
*H04N 25/766* (2023.01)
*H10F 30/225* (2025.01)
*H10F 39/18* (2025.01)

(52) U.S. Cl.
CPC .......... *H10F 39/18* (2025.01); *H10F 39/807* (2025.01); *H10F 39/811* (2025.01); *G01S 7/497* (2013.01); *G01S 17/89* (2013.01); *H10F 30/225* (2025.01)

(58) Field of Classification Search
USPC .......... 348/207.99
See application file for complete search history.

(56) References Cited

U.S. PATENT DOCUMENTS

| | | | |
|---|---|---|---|
| 2007/0222678 | A1 | 9/2007 | Ishio et al. |
| 2008/0308738 | A1 | 12/2008 | Li et al. |
| 2009/0121306 | A1 | 5/2009 | Ishikawa |
| 2012/0057056 | A1 | 3/2012 | Oike |
| 2015/0285625 | A1 | 10/2015 | Deane |
| 2016/0254310 | A1 | 9/2016 | Yagi et al. |
| 2018/0090536 | A1 | 3/2018 | Mandai et al. |
| 2018/0180470 | A1 | 6/2018 | Seitz |
| 2018/0315738 | A1 | 11/2018 | Bono et al. |
| 2019/0252442 | A1 | 8/2019 | Tanaka et al. |
| 2021/0183928 | A1 | 6/2021 | Hoshi et al. |

FOREIGN PATENT DOCUMENTS

| | | | |
|---|---|---|---|
| CN | 101563779 | A | 10/2009 |
| CN | 201741697 | U | 2/2011 |
| CN | 104101880 | A | 10/2014 |
| CN | 105009289 | A | 10/2015 |
| CN | 205050839 | U | 2/2016 |
| CN | 106165399 | A | 11/2016 |
| CN | 106489093 | A | 3/2017 |
| CN | 108139468 | A | 6/2018 |
| DE | 102016008904 | A1 | 1/2018 |
| JP | 2006-179828 | A | 7/2006 |
| JP | 2007-273934 | A | 10/2007 |
| JP | 2008-311651 | A | 12/2008 |
| JP | 2010-091378 | A | 4/2010 |
| JP | 2010-536186 | A | 11/2010 |
| JP | 2012-60012 | A | 3/2012 |
| JP | 2012-068066 | A | 4/2012 |
| JP | 2014-059301 | A | 4/2014 |
| JP | 2014-077658 | A | 5/2014 |
| JP | 2015-078953 | A | 4/2015 |
| JP | 2015-084392 | A | 4/2015 |
| JP | 2015-179087 | A | 10/2015 |
| JP | WO 2015/157341 | A1 | 10/2015 |
| JP | 2016-211881 | A | 12/2016 |
| JP | 2016-540979 | A | 12/2016 |
| JP | 2017-108062 | A | 6/2017 |
| JP | 2017-520134 | A | 7/2017 |
| JP | 2018-088488 | A | 6/2018 |
| TW | 201203528 | A | 1/2012 |
| TW | 201440952 | A | 11/2014 |
| TW | 201637188 | A | 10/2016 |
| WO | WO 2009/022166 | A2 | 2/2009 |
| WO | WO 2015/076880 | A1 | 5/2015 |
| WO | WO 2017/059777 | A1 | 4/2017 |
| WO | 2017/106875 | A1 | 6/2017 |
| WO | WO 2017/180277 | A1 | 10/2017 |
| WO | WO 2018/021413 | A1 | 2/2018 |
| WO | 2018/100082 | A1 | 6/2018 |
| WO | WO 2018/101033 | A1 | 6/2018 |

OTHER PUBLICATIONS

International Preliminary Report on Patentability mailed Jan. 28, 2021 for PCT/JP2019/022950.

J2 Complex Inc., Japan, "Toshiba Develops Circuit Technology for Long-Range LiDAR for Autonomous Driving Systems with a Measurement Range of 200m", URL: https://www.nextmobility.jp/new_technology/toshiba-developslong-distance-lidar-circuit-technology-for-automatic-operation-system-with-measurable-distance-of-200-m20180305/, Mar. 5, 2018, p. 1, including English machine translation.

4
11
14
12C
25
24
20C
12A
12B
12
22
21
Hn
U
20A
20B
20
Z
Y
X 4
11
12C
15
28
27
26
20C
12A
12B
12
23
21
U
Rm
20A
20B
20
X
Z
Y 15
33
SIGNAL PROCESSING SECTION
37
TIME MEASURING UNIT
32
36
35
DAC
11
HN
APD
34
HV_1
HV_N
H1
APD
34
Rm
31

LIGHT PROJECTION POSITION
LASER LIGHT
HV
HV_1
HV_2
HV_3
HV_N
OUTPUT
OUTPUT_1
OUTPUT_2
OUTPUT_3
OUTPUT_M
PERIOD
P1
P2
P3
PN
t1
t2
t3
tN 40
41
43C
43
44B
44C
46
42C
42
21
43A
U
42A
43B
42B
44A
Hn
44
47
Z
Y
X 40
41
43C
43
44B
44C
48
42C
42
43A
21
43B
U
21
U
21
42A
U
21
U
42B
44A
Rm
21
U
21
44
49
Z
X
Y

41
Hn-1
Hn
Hn+1
Rm-1
Rm
44
44A
44B
43
21
OA
51
53
54
55
56
61
62
63
64
65
X
Y
Z 41
45
44
53
54
61
62
56
21
43
Y
Z
X
55
43B
64
65
66
44B
51
U
APD
44A
43A
OA 70
73
43C
43
44C
72
43A
21
43B
U
71
Hpn
Z
Y
X
44A
44
44B 70
73
43A
43C
43
43B
44C
44B
72
44A
21
U
71
Rpm
Z
X
Y
44

PHOTODETECTION DEVICE, SEMICONDUCTOR PHOTODETECTION ELEMENT, AND METHOD FOR DRIVING SEMICONDUCTOR PHOTODETECTION ELEMENT

TECHNICAL FIELD

The present invention relates to a photodetection device, a semiconductor photodetection element, and a method for driving a semiconductor photodetection element.

BACKGROUND ART

A photodetection device that includes a light receiving unit with a semiconductor substrate is known (see, for example, Patent Literature 1). The semiconductor substrate includes a plurality of cells that are arrayed two-dimensionally. The photodetection device stores a depth map of a three-dimensional image that is detected by using distance information obtained from the propagation time of light. Each of the cells includes an avalanche photodiode that is arranged to operate in a Geiger mode. The light receiving unit receives reflected light of light that is irradiated from a light source toward a monitoring region. The light receiving unit outputs a signal in accordance with the reflected light. The avalanche photodiode operates in the Geiger mode by application of a bias voltage. Hence, each of the cells in the light receiving unit outputs a signal by the operation of the avalanche photodiode in the Geiger mode.

CITATION LIST

Patent Literature

Patent Literature 1: Japanese Unexamined Patent Publication No. 2014-59301

SUMMARY OF INVENTION

Technical Problem

An object of one aspect of the present invention is to provide a photodetection device in which the configuration of a wire that applies a bias voltage to each of the avalanche photodiodes and a wire that reads a signal from each of the cells can be simplified. An object of another aspect of the present invention is to provide a semiconductor photodetection element in which the configuration of a wire that applies a bias voltage to each of the avalanche photodiodes and a wire that reads a signal from each of the cells can be simplified. An object of yet another aspect of the present invention is to provide a method for driving a semiconductor photodetection element in which the configuration of a wire that applies a bias voltage to each of the avalanche photodiodes and a wire that reads a signal from each of the cells can be simplified.

Solution to Problem

A photodetection device according to one aspect of the present invention includes: a light projecting unit that is arranged to project light toward a detection target region, the light having a cross-sectional shape whose longitudinal direction corresponds to a first direction; a light receiving unit that is arranged to receive reflected light of the light projected by the light projecting unit; and a controller that is connected to the light receiving unit. The light receiving unit includes a semiconductor substrate including a plurality of cells arrayed two-dimensionally in M rows and N columns (M and N are integers equal to or greater than 2). Each of the plurality of cells includes at least one avalanche photodiode arranged to operate in a Geiger mode. In each of N first cell groups each of which includes M cells aligned in a column direction, first regions of cells included in a first cell group are electrically connected to each other, a first region being one of anode and cathode of a cell. In each of M second cell groups each of which includes N cells aligned in a row direction, second regions of cells included in a second cell group are electrically connected to each other, a second region being the other of the anode and the cathode of the cell. The light projecting unit is arranged to scan the light along a second direction intersecting the first direction such that the reflected light is incident on each first cell group or each plurality of first cell groups. The controller is arranged to apply, in accordance with the incidence of the reflected light, a bias voltage that makes the avalanche photodiode operate in the Geiger mode to each first cell group or each plurality of first cell groups. The controller is arranged to read signals from the cells included in the first cell group or the plurality of first cell groups to which the bias voltage that makes the avalanche photodiode operate in the Geiger mode has been applied.

In the aspect described above, the light projecting unit scans, in the second direction, the light having the cross-sectional shape whose longitudinal direction corresponds to the first direction, and thus in the light receiving unit, the reflected light is incident on each one of the first cell groups or each plurality of the first cell groups. The controller applies, in accordance with the incidence of the reflected light, the bias voltage to each one of the first cell groups or each plurality of the first cell groups. Hence, for example, wires for applying the bias voltage to the cells may be respectively provided for each of the first cell groups, and may be electrically connected to the avalanche photodiodes within the cells included in the corresponding first cell group. The controller reads signals from the cells included in each one of the first cell groups or each plurality of the first cell groups to which the bias voltage has been applied. Hence, for example, wires for reading signals from the cells may be respectively provided for each of the M cell groups each of which includes the N cells aligned in the row direction, and may be electrically connected to the avalanche photodiodes within the cells included in the corresponding cell group of the M cell groups. Consequently, in the aspect described above, the configuration of the wire that is arranged to apply the bias voltage to each of the avalanche photodiodes and the wire that is arranged to read a signal from each of the cells can be simplified.

In the aspect described above, the light projecting unit may scan the light along the second direction such that the reflected light is incident on each of the first cell groups. In this case, in the light receiving unit, the reflected light is incident on each of the first cell groups. The controller may apply, in accordance with the incidence of the reflected light, the bias voltage that makes the avalanche photodiode operate in the Geiger mode to each of the first cell groups, and may read signals from the M cells included in the first cell group to which the bias voltage that makes the avalanche photodiode operate in the Geiger mode has been applied.

In this configuration, as in the configuration described above, for example, the wires for applying the bias voltage to the cells may be respectively provided for each of the first cell groups, and may be electrically connected to the avalanche photodiodes within the cells included in the corresponding first cell group. For example, the wires for reading signals from the cells may be respectively provided for each of the M cell groups each of which includes the N cells aligned in the row direction, and may be electrically connected to the avalanche photodiodes within the cells included in the corresponding cell group of the M cell groups. Consequently, in this configuration, the configuration of the wire that is arranged to apply the bias voltage to each of the avalanche photodiodes and the wire that is arranged to read a signal from each of the cells can be simplified.

In the aspect described above, the photodetection device may include a plurality of first wires and a plurality of second wires. In this case, the first wires are respectively provided for each of the first cell groups. The second wires are respectively provided for each of the second cell groups. Each of the first wires may be electrically connected to the first regions of the M cells included in a corresponding first cell group of the N first cell groups. Each of the second wires may be electrically connected to the second regions of the N cells included in a corresponding second cell group of the M second cell groups. The controller may apply, through each of the first wires, the bias voltage to the M cells included in the corresponding first cell group, and read signals through each of the second wires.

In this configuration, through each of the first wires, for each corresponding first cell group of the N first cell groups, the bias voltage is applied to the avalanche photodiode within each of the cells included in the first cell group. Through each of the second wires, for each corresponding second cell group of the M second cell groups, a signal is read from the avalanche photodiode within each of the cells included in the second cell group. Hence, in this configuration, the configuration of the first and second wires is simplified.

The avalanche photodiode performs avalanche multiplication by the application of the bias voltage. Hence, photoelectrons generated by the incidence of light are multiplied, and thus the avalanche photodiode outputs a signal caused by the multiplied photoelectrons. Even in the avalanche photodiode to which the bias voltage is not applied, photoelectrons are generated by the incidence of light. A signal output from the avalanche photodiode to which the bias voltage is not applied is extremely small as compared with the signal output from the avalanche photodiode to which the bias voltage is applied.

In this configuration, not only the cell to which the bias voltage is being applied but also the cell to which the bias voltage is not being applied is electrically connected to the second wire. Hence, the controller also reads signals from the cells to which the bias voltage is not applied. As described above, the signal output from the avalanche photodiode within the cell to which the bias voltage is not applied is extremely small, and thus the influence of that signal on the entire signal to be read through the second wire is extremely small. Consequently, the detection accuracy in the photodetection device is enhanced.

In the aspect described above, each of the first wires may include a first branch wire and a second branch wire. In this case, the first branch wire is electrically connected to the first regions of some cells included in the corresponding first cell group. The second branch wire is electrically connected to the first regions other cells included in the corresponding first cell group.

For example, when all the cells included in the first cell group are electrically connected to one first wire, a difference between a wire distance up to a cell located in one end of the column direction and a wire distance up to a cell located in the other end of the column direction is large. When the difference between the wire distances up to the cells is large, a difference between the timings at which the bias voltage is applied to the cells is also large.

In this configuration, the difference between the wire distances up to the cells is small as compared with a case where all the cells included in the first cell group are electrically connected to one first wire. Hence, the difference between the timings at which the bias voltage is applied to the cells is small.

In the aspect described above, each of the second wires may include a third branch wire and a fourth branch wire. In this case, the third branch wire is electrically connected to the second regions of some cells included in the corresponding second cell group. The fourth branch wire is electrically connected to the second regions of other cells included in the corresponding second cell group.

For example, when all the cells included in the second cell group are electrically connected to one second wire, a difference between a wire distance from a cell located in one end of the row direction and a wire distance from a cell located in the other end of the row direction is large. When the wire distances from the cells are long, noise may be included in signals read through the second wire due to the influence of a parasitic capacitance generated in the second wire and the like.

In this configuration, the wire distances from the cells are short as compared with a case where all the cells included in the second cell group are electrically connected to one second wire. Hence, noise is unlikely to be included in the signals read through the second wires. Consequently, a decrease in the detection accuracy in the photodetection device is reduced.

In the aspect described above, the photodetection device may further include a circuit board that includes the controller. Each of the plurality of cells may be electrically connected to the circuit board. The plurality of first wires and the plurality of second wires may be provided in the circuit board.

In this configuration, the first wires provided for each of the first cell groups and the second wires provided for each of the second cell groups are provided in the circuit board. Hence, in this configuration, for example, as compared with a case where the first wires and the second wires are disposed in the semiconductor substrate, a member that protects the first wires and the second wires is not needed. Consequently, the configuration of the photodetection device can be simplified.

In the aspect described above, in the semiconductor substrate, a trench may be formed to separate first cell groups that are adjacent to each other.

In this configuration, the first cell groups that are adjacent to each other are electrically separated by the trench. Hence, when the bias voltage is applied to the cells included in one first cell group, the bias voltage is unlikely to be applied to the cells included in first cell groups that are adjacent in the row direction to that first cell group. Consequently, the first cell groups that are adjacent in the row direction are unlikely to perform avalanche multiplication.

In the aspect described above, the semiconductor substrate may include a first main surface and a second main surface that oppose each other. In the semiconductor substrate, a trench that opens in the first main surface and the second main surface may be formed. The trench may surround each of the plurality of cells when viewed in a direction orthogonal to the first main surface.

In this configuration, the respective cells are electrically separated by the trench. Hence, electrical crosstalk occurring between signals generated in cells adjacent to each other among the M cells included in the first cell group to which the bias voltage is applied is reduced. Consequently, the detection accuracy in the photodetection device is enhanced.

A semiconductor photodetection element according to another aspect of the present invention includes a semiconductor substrate, a plurality of first wires, and a plurality of second wires. The semiconductor substrate includes a plurality of cells arrayed two-dimensionally in M rows and N columns (M and N are integers equal to or greater than 2). The plurality of first wires are respectively provided for each of N first cell groups each of which includes M cells aligned in a column direction. The plurality of second wires are respectively provided for each of M second cell groups each of which includes N cells aligned in a row direction. Each of the plurality of cells includes at least one avalanche photodiode arranged to operate in a Geiger mode. Each of the first wires is electrically connected to first regions of the M cells included in a corresponding first cell group of the N first cell groups, a first region being one of anode and cathode of a cell. Each of the second wires is electrically connected to second regions of the N cells included in a corresponding second cell group of the M second cell groups, a second region being the other of anode and cathode of the cell.

In the other aspect described above, for example, through each of the first wires, for each corresponding first cell group of the N first cell groups, the bias voltage is applied to the avalanche photodiode within each of the cells included in the corresponding first cell group. For example, through each of the second wires, for each corresponding second cell group of the M second cell groups, a signal is read from the avalanche photodiode within each of the cells included in the corresponding second cell group. Hence, in the other aspect described above, the configuration of the first and second wires can be simplified.

When the signal is read through the second wire, as described above, not only the cell to which the bias voltage is being applied but also the cell to which the bias voltage is not being applied is electrically connected to the second wire. Hence, signals are read from the cells to which the bias voltage is not applied. As described above, the signal output from the avalanche photodiode within the cell to which the bias voltage is not applied is extremely small, and thus the influence of that signal on the entire signal to be read through the second wire is extremely small. Consequently, the detection accuracy in the photodetection element is enhanced.

In the other aspect described above, each of the first wires may include a first branch wire and a second branch wire. In this case, the first branch wire is electrically connected to the first regions of some cells included in the corresponding first cell group. The second branch wire is electrically connected to the first regions of other cells included in the corresponding first cell group.

In this configuration, as described above, the difference between the wire distances up to the cells is small as compared with a case where all the cells included in the first cell group are electrically connected to one first wire. Hence, the difference between the timings at which the bias voltage is applied to the cells is small.

In the other aspect described above, each of the second wires may include a third branch wire and a fourth branch wire. In this case, the third branch wire is electrically connected to the second regions of some cells included in the corresponding second cell group. The fourth branch wire is electrically connected to the second regions of other cells included in the corresponding second cell group.

In this configuration, as described above, the wire distances from the cells are short as compared with a case where all the cells included in the second cell group are electrically connected to one second wire. Hence, noise is unlikely to be included in the signals read through the second wires. Consequently, a decrease in the detection accuracy in the photodetection device is reduced.

In the other aspect described above, in the semiconductor substrate, a trench may be formed to separate first cell groups that are adjacent to each other.

In this configuration, as described above, the first cell groups that are adjacent in the row direction to the first cell groups to which the bias voltage is applied are unlikely to perform avalanche multiplication.

In the other aspect described above, the semiconductor substrate may include a first main surface and a second main surface that oppose each other. In the semiconductor substrate, a trench that opens in the first main surface and the second main surface may be formed. The trench may surround each of the plurality of cells when viewed in a direction orthogonal to the first main surface.

In this configuration, as described above, the detection accuracy in the photodetection element is enhanced.

A method for driving a semiconductor photodetection element according to yet another aspect of the present invention includes: applying a bias voltage to each of N first cell groups through a corresponding first wire of a plurality of first wires at different timings; and making avalanche photodiodes included in M cells of the first cell group to which the bias voltage is being applied operate in a Geiger mode.

In this driving method, as described above, the configuration of the first and second wires is simplified.

Advantageous Effects of Invention

By one aspect of the present invention, a photodetection device is provided in which the configuration of a wire that applies a bias voltage to each of the avalanche photodiodes and a wire that reads a signal from each of the cells can be simplified. By another aspect of the present invention, a semiconductor photodetection element is provided in which the configuration of a wire that applies a bias voltage to each of the avalanche photodiodes and a wire that reads a signal from each of the cells can be simplified. By yet another aspect of the present invention, a method for driving a semiconductor photodetection element is provided in which the configuration of a wire that applies a bias voltage to each of the avalanche photodiodes and a wire that reads a signal from each of the cells can be simplified.

DESCRIPTION OF EMBODIMENTS

Figure 1:
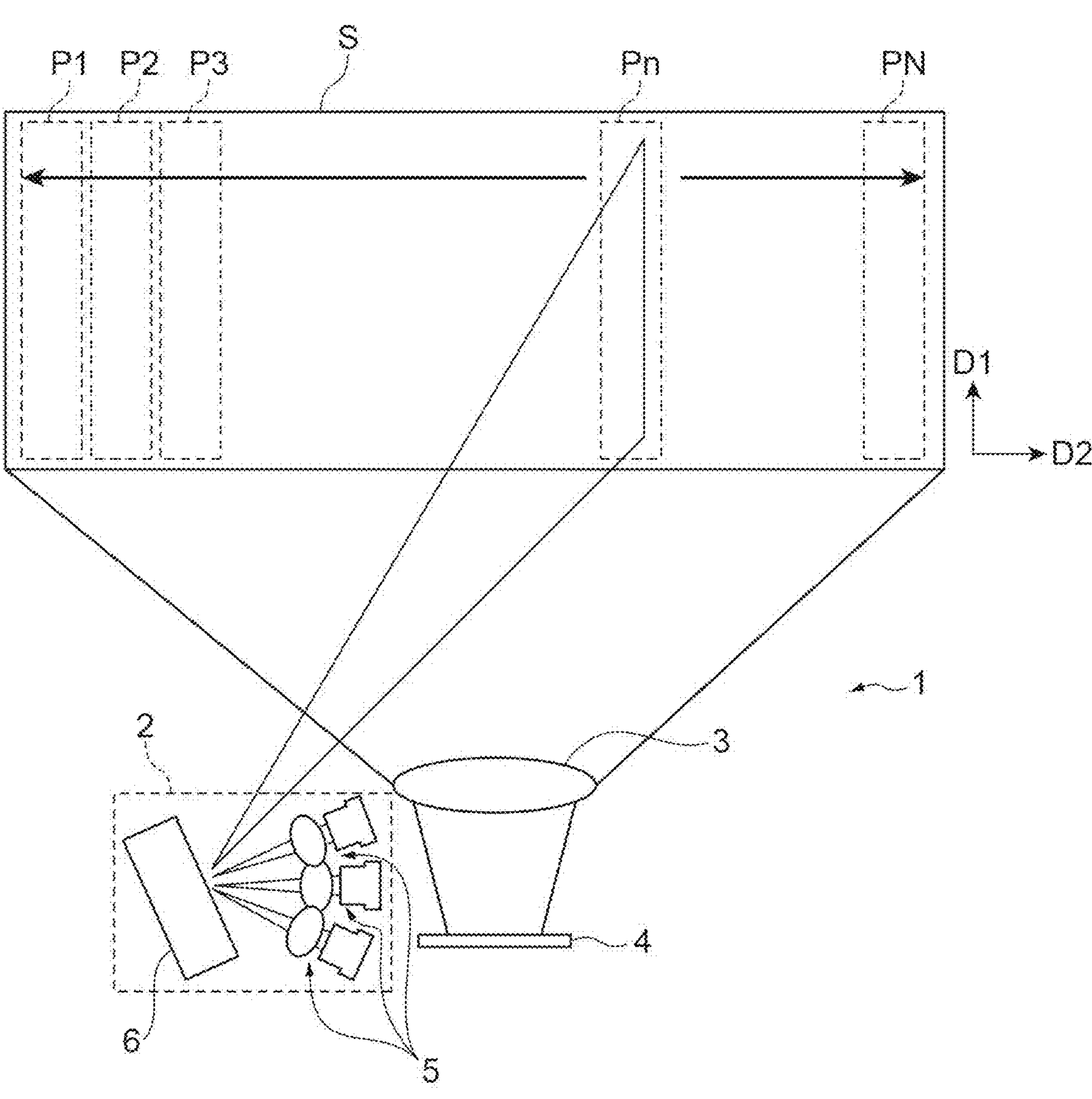
FIG. 1 is a schematic configuration diagram of a photodetection device according to a first embodiment.

Embodiments of the present invention will be hereinafter described in detail with reference to the attached drawings. In the description, the same reference numerals are used for the same elements or elements having the same functions, and repeated description is omitted.

A photodetection device according to a first embodiment will first be described with reference to FIG. 1. FIG. 1 is a schematic configuration diagram of the photodetection device according to the first embodiment.

As shown in FIG. 1, the photodetection device 1 includes a light projecting unit 2, a lens 3, and a light receiving unit 4. The light projecting unit 2 is a device that projects laser light. The light projecting unit 2 is disposed in a position where the light projecting unit 2 can project the laser light toward a detection target region S. The light receiving unit 4 is a device that receives reflected light of the laser light. The light receiving unit 4 is disposed in a position where the light receiving unit 4 can receive the reflected light. For example, when an object is present in the detection target region S, the laser light projected from the light projecting unit 2 is reflected by the object. The laser light that is reflected by the object, that is, the reflected light is incident on the light receiving unit 4. The detection target region S is set previously and optionally, and is rectangular in the present embodiment. The photodetection device 1 forms, for example, LiDAR (Light Detection and Ranging). The light projecting unit 2 forms, for example, a light projecting unit.

The light projecting unit 2 includes a plurality of laser light sources 5 and a mirror 6. The laser light source 5 generates laser light. The laser light source 5 emits the generated laser light toward the mirror 6. For example, individual beams of light that are emitted from the laser light sources 5 are incident on the mirror 6 in a state where they are collimated (adjusted so as to travel parallel to each other). The mirror 6 reflects, toward the detection target region S, the laser light beams that are emitted by the laser light sources 5. The light that is reflected by the mirror 6 and that is projected toward the detection target region S has, for example, an oval shape or an ellipse shape on a plane orthogonal to the direction of light projection. The light projecting unit 2 projects the laser light toward the detection target region S, the laser light having a cross-sectional shape whose longitudinal direction corresponds to a direction D1 and whose lateral direction corresponds to a direction D2. In other words, in the cross-sectional shape of the laser light, the direction D1 is the direction of the major axis of the oval or the ellipse, and the direction D2 is the direction of the minor axis of the oval or the ellipse. The cross-sectional shape of the laser light may be a linear shape along the direction D1. The mirror 6 forms a scanning section of the light projecting unit 2 that scans the laser light, and is, for example, a galvano mirror or a MEMS mirror. For example, the scanning section of the light projecting unit 2 may be formed of a mechanism other than the mirror 6 that changes the direction of light projection (light projection position) of the laser light.

In the present embodiment, as shown in FIG. 1, the light projecting unit 2 projects the laser light toward each of light projection positions P1 to PN included in the detection target region S, and projects the laser light sequentially from the light projection position P1 to the light projection position PN. N is an integer equal to or greater than 2. The laser light is projected sequentially from the light projection position P1 to the light projection position PN, and thus the light projecting unit 2 scans the laser light along the direction D2. For example, the laser light that is projected toward one of the light projection positions P1 to PN is generated by the laser light sources 5. The laser light that is projected toward one of the light projection positions P1 to PN may be generated by a single laser light source 5. In this case, the laser light that is projected toward one light projection position may be emitted, by controlling the angle of the mirror 6, at different timings sequentially from an end thereof along the direction D1 in the light projection position. For example, when the direction D1 is a first direction, the direction D2 is a second direction.

The light projecting unit 2 includes an unillustrated controller. For example, the controller of the light projecting unit 2 drives and controls the mirror 6 to control the light projection position of the laser light projected from the light projecting unit 2. The controller of the light projecting unit 2 transmits position information indicating any one of the light projection positions P1 to PN and time information indicating a time at which the light projection is started to a controller 13 of the light receiving unit 4.

The reflected light that is reflected in the detection target region S is incident on the lens 3. The lens 3 collects the reflected light that is incident thereon such that the reflected light is incident on the light receiving unit 4. The light receiving unit 4 outputs a plurality of light reception signals corresponding to the reflected light that is incident through the lens 3. The configuration and the function of the light receiving unit 4 will be described later. In the photodetection device 1, for example, based on the light reception signals, for each of the sectioned regions obtained by dividing the detection target region S into a plurality of sections, a distance from the photodetection device 1 to a portion of the object which is in the section region is measured. In this case, the light projection positions P1 to PN of the laser light projected from the light projecting unit 2 are set according to the positions of the section regions.

Figure 2:
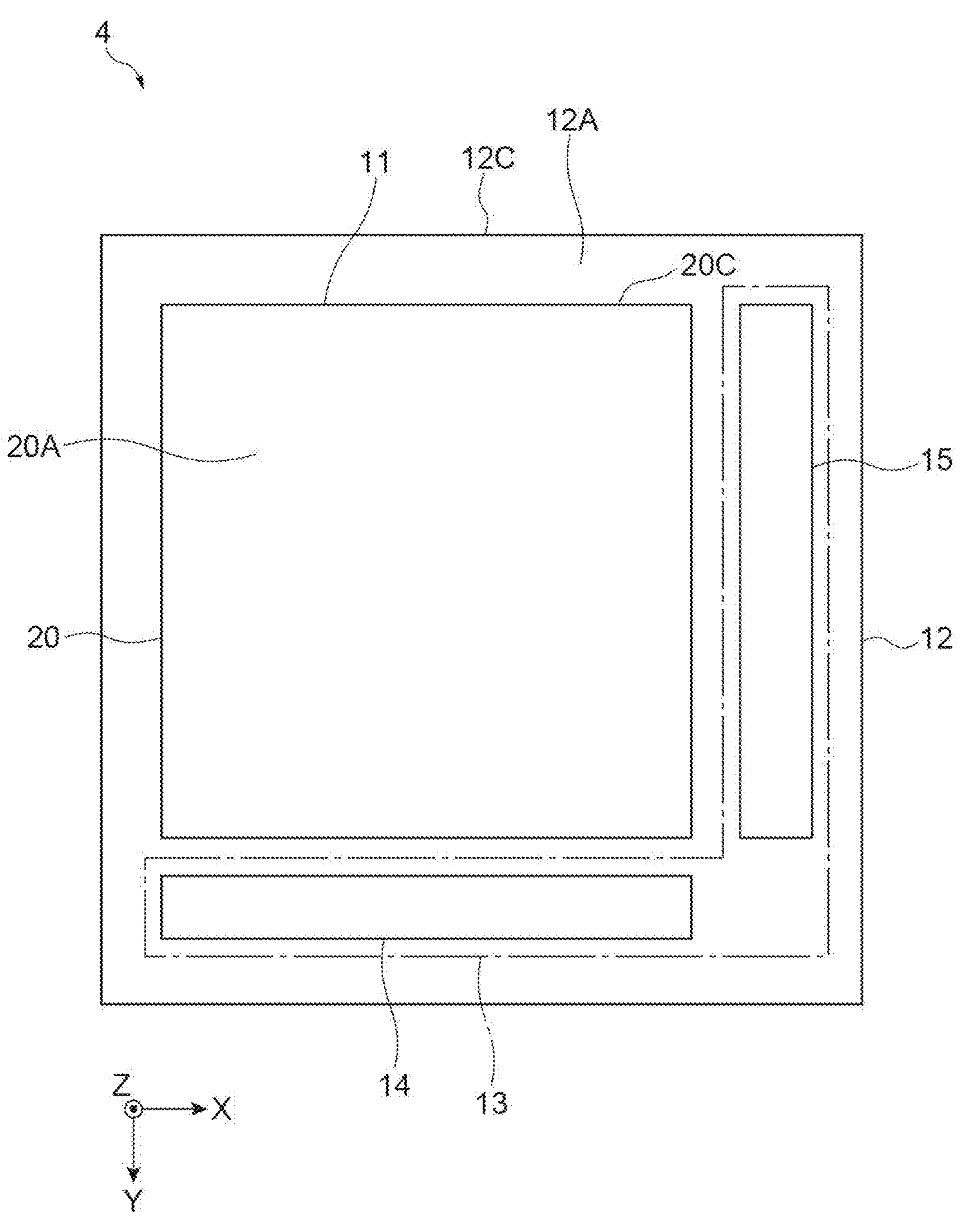
FIG. 2 is a schematic view of a light receiving unit included in the photodetection device.
Figure 3:
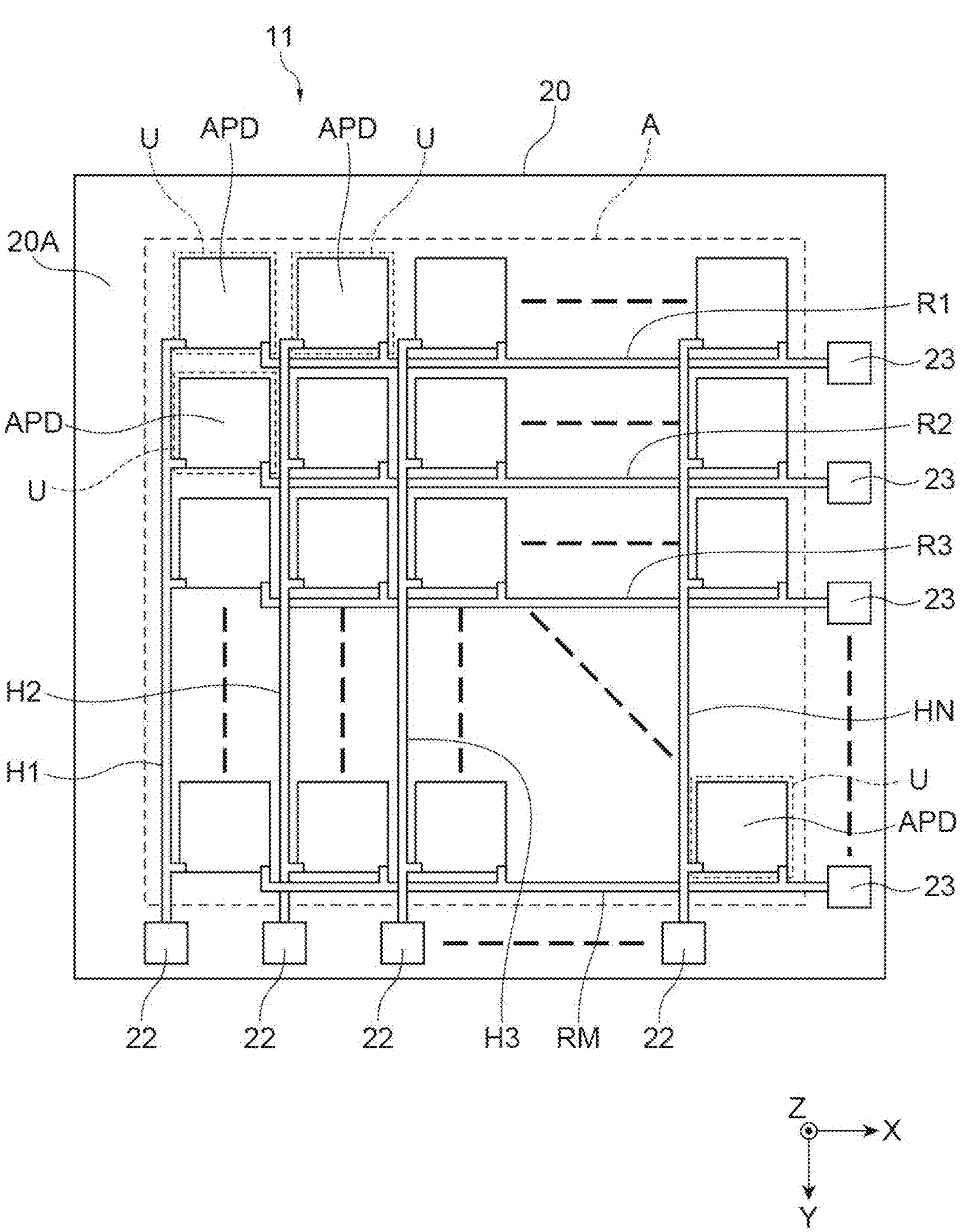
FIG. 3 is a schematic plan view of a semiconductor photodetection element.
Figure 4:
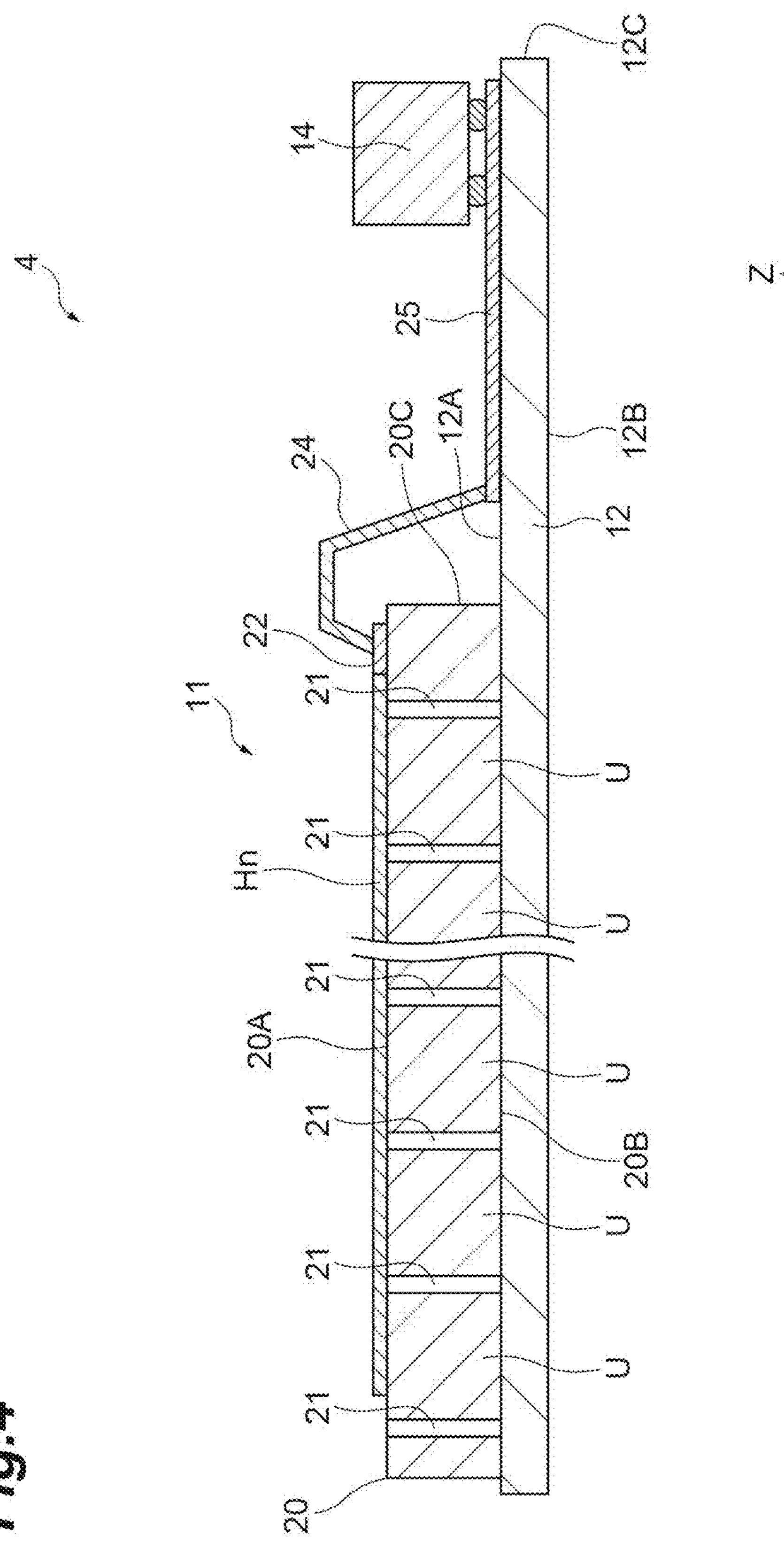
FIG. 4 is a schematic view showing a sectional configuration of the light receiving unit.
Figure 5:
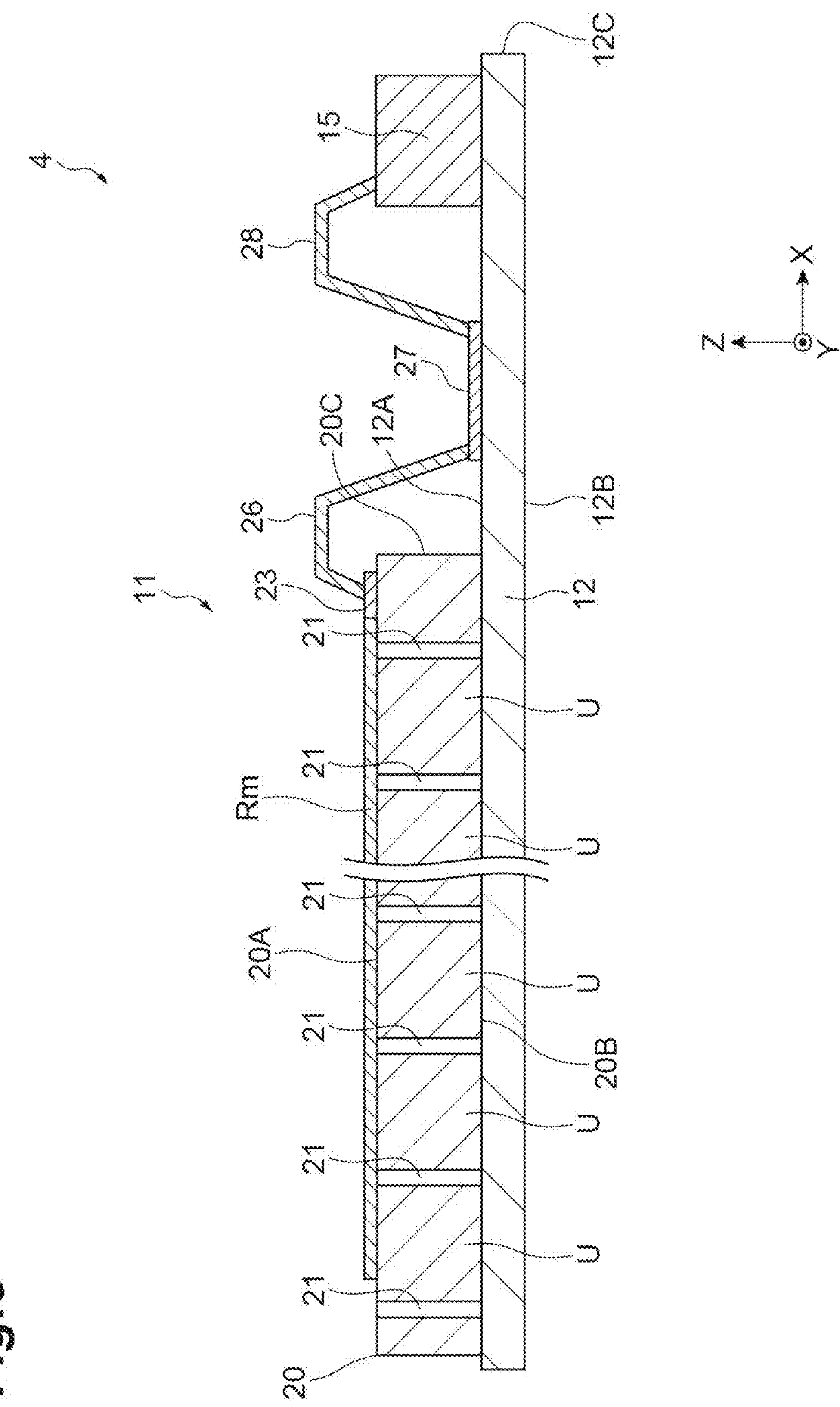
FIG. 5 is a schematic view showing a sectional configuration of the light receiving unit.
Figure 6:
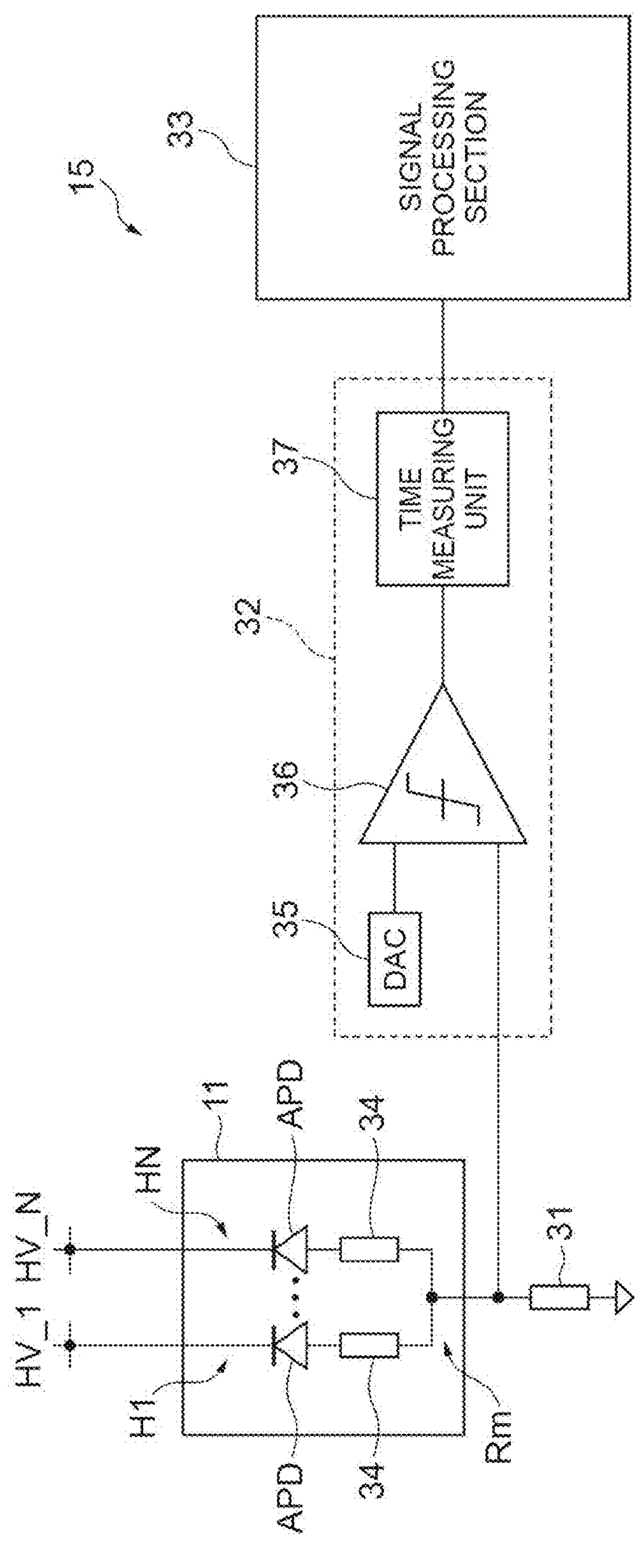
FIG. 6 is a diagram showing an example of a circuit of a reading section.

The configuration of the light receiving unit 4 will next be described with reference to FIGS. 2 to 6. FIG. 2 is a schematic view of the light receiving unit included in the photodetection device. FIG. 3 is a schematic plan view of a semiconductor photodetection element. FIG. 4 is a schematic view showing a sectional configuration of the light receiving unit. FIG. 5 is a schematic view showing a sectional configuration of the light receiving unit. FIG. 6 is a diagram showing an example of a circuit of a reading section.

As shown in FIG. 2, the light receiving unit 4 includes a semiconductor photodetection element 11, a mounting board 12, and the controller 13. The controller 13 is connected to the semiconductor photodetection element 11. The controller 13 includes a switching section 14 and a reading section 15. The semiconductor photodetection element 11 includes a semiconductor substrate 20. The semiconductor substrate 20 and the mounting board 12 are disposed to oppose each other. In the present embodiment, the semiconductor substrate 20 is provided on the mounting board 12. Each of the semiconductor substrate 20 and the mounting board 12 has a rectangular shape in plan view. The semiconductor photodetection element 11 forms, for example, a light receiving unit. The semiconductor photodetection element 11 is, for example, a semiconductor photodetection element of a surface incident type.

The semiconductor substrate 20 includes a main surface 20A and a main surface 20B that oppose each other and side surfaces 20C (see FIG. 4). The mounting board 12 includes a main surface 12A and a main surface 12B that oppose each other and side surfaces 12C (see FIG. 4). The main surface 20B of the semiconductor substrate 20 faces the main surface 12A of the mounting board 12. Here, the main surface 20B is in contact with the main surface 12A. The main surface 20A is a surface on which light to the semiconductor photodetection element 11 is incident. In the present embodiment, a plane that is parallel to the respective main surfaces of the semiconductor substrate 20 and the mounting board 12 is an XY axis plane, and a direction that is orthogonal to the respective main surfaces is a Z axis direction. For example, when the main surface 20A forms a first main surface, the main surface 20B forms a second main surface.

As shown in FIG. 3, in plan view, the semiconductor substrate 20 includes a plurality of cells U that are arrayed two-dimensionally in M rows and N columns. M and N are integers equal to or greater than 2. In the semiconductor substrate 20, a signal corresponding to the reflected light detected in each of the cells U is output from the cell U. For example, a current signal corresponding to the reflected light is output from each of the cells U. The number of cells U is, for example, "1024 (32 rows×32 columns)". Each of the cells U includes one or a plurality of avalanche photodiodes APD. A bias voltage is applied to the avalanche photodiode APD, and thus the avalanche photodiode APD operates in a Geiger mode. The bias voltage that is applied to the avalanche photodiode APD is equal to or greater than a breakdown voltage. The reflected light is incident on the avalanche photodiode APD that is operating in the Geiger mode, and thus the avalanche photodiode APD generates a current signal corresponding to the reflected light. In the semiconductor substrate 20, a light receiving region A is formed that is a region in which the cells U arrayed two-dimensionally are located. In other words, an outer edge of the light receiving region A surrounds all the cells U when viewed in the Z axis direction. In the photodetection device 1, disposing positions of the lens 3 and the light receiving unit 4 or optical functions of the lens 3 are adjusted such that the reflected light is incident on the light receiving region A.

As shown in FIGS. 4 and 5, in the semiconductor substrate 20, a trench 21 is formed. The trench 21 opens in the main surface 20A and the main surface 20B. In other words, the trench 21 penetrates the semiconductor substrate 20 in a direction (Z axis direction) in which the main surface 20A and the main surface 20B oppose each other. The Z axis direction is also a thickness direction of the semiconductor substrate 20. The trench 21 separates, among the cells U, cells U that are adjacent to each other. Specifically, the trench 21 surrounds each of the cells U when viewed in a direction (Z axis direction) orthogonal to the main surface 20A. By the trench 21, among the cell groups of the first to the N-th columns which will be described later, cell groups that are adjacent to each other are physically separated therebetween, and among the cell groups of the first to the M-th rows which will be described later, cell groups that are adjacent to each other are physically separated therebetween. In other words, by the trench 21, among the cell groups of the first to the N-th columns, the cell groups that are adjacent to each other are electrically separated therebetween, and among the cell groups of the first to the M-th rows, the cell groups that are adjacent to each other are electrically separated therebetween. The trench 21 does not need to surround, among the cells U, the entire peripheries of cells U that are adjacent to the outer edge of the light receiving region A on the XY axis plane. In the cell U that are adjacent to the outer edge of the light receiving region A, the trench 21 may be formed only between the cell U that are adjacent to the outer edge of the light receiving region A and another cell U, which is located on the inner side of the cell U and is adjacent to the cell. In the trench 21, a light-shielding member that shields light may be provided. The light-shielding member may be covered with an insulating film. In this case, the cells U that are adjacent to each other are optically separated by the light-shielding member therebetween.

The semiconductor photodetection element 11 further includes a plurality of wires H1 to HN and a plurality of wires R1 to RM. The wires H1 to HN are respectively provided for each of the columns of the cell groups of the first to the N-th columns included in the cells U. The wires R1 to RM are respectively provided for each of the rows of the cell groups of the first to the M-th rows included in the cells U. The cell group of the n-th column among the cell groups of the first to the N-th columns is formed of a plurality of cells U (M cells U) that are located in the n-th column when counted sequentially from the negative direction of an X axis direction. Unless n represents the conductivity type of a semiconductor region, n represents an integer of 1 to N. The cell group of the n-th column includes cells U of the first to the M-th rows that are located in the n-th column and that are aligned in a column direction. The cell group of the m-th row among the cell groups of the first to the M-th rows is formed of a plurality of cells U (N cells U) that are located in the m-th row when counted sequentially from the negative direction of a Y axis direction. m is an integer of 1 to M. The cell group of the m-th row includes cells U of the first to the N-th columns that are located in the m-th row and that are aligned in a row direction. In the present embodiment, the column direction is the Y axis direction, and the row direction is the X axis direction. For example, the cell groups of the first to the N-th columns form N first cell groups, and the cell groups of the first to the M-th rows form M second cell groups.

Among the wires H1 to HN, a wire Hn that is located in the n-th position when counted from the negative direction of the X axis direction is provided for the cell group of the n-th column. The wire Hn is electrically connected to the avalanche photodiodes APD included in the cell group of the n-th column. In other words, the wire Hn is electrically connected to the cells U of the first to the M-th rows located in the n-th column. The wire Hn is electrically connected to a semiconductor region that forms the avalanche photodiodes APD. For example, the wire Hn is electrically connected to a p-type semiconductor region. In the light receiving unit 4, the bias voltage that makes each of the avalanche photodiodes APD operate in the Geiger mode is applied to the avalanche photodiodes APD.

The semiconductor photodetection element 11 includes a plurality of pad electrodes 22 (N pad electrodes 22). The pad electrodes 22 are provided outside the light receiving region A of the semiconductor substrate 20 on the XY axis plane. The pad electrodes 22 are respectively provided for each of the columns of the cell groups of the first to the N-th columns. The wires H1 to HN are electrically connected to the pad electrodes 22, respectively.

Among the wires R1 to RM, a wire Rm that is located in the m-th position when counted from the negative direction of the Y axis direction is provided for the cell group of the m-th row. The wire Rm is electrically connected to the avalanche photodiodes APD included in the cell group of the m-th row. The wire Rm is electrically connected to a semiconductor region that forms the avalanche photodiodes APD. For example, the wire Rm is electrically connected to a n-type semiconductor region. In the light receiving unit 4, a signal that is generated in each of the avalanche photodiodes APD is read through the wire Rm.

The semiconductor photodetection element 11 includes a plurality of pad electrodes 23 (M pad electrodes 23). The pad electrodes 23 are provided outside the light receiving region A of the semiconductor substrate 20 on the XY axis plane. The pad electrodes 23 are respectively provided for each of the rows of the cell groups of the first to the M-th rows. The wires R1 to RM are electrically connected to the pad electrodes 23, respectively.

The switching section 14 and the reading section 15 form the controller 13 that controls the semiconductor photodetection element 11. The switching section 14 and the reading section 15 are provided on the mounting board 12. The switching section 14 and the reading section 15 are formed of, for example, hardware. Examples of the hardware include a register, a memory, a comparator, a computing unit, a multiplier, a selector, an A/D converter, and a power supply control circuit. The resister is formed of, for example, a logic circuit. The logic circuit includes, for example, an AND gate, an OR gate, a NOT gate, and an XOR gate. A portion or the whole of the switching section 14 and the reading section 15 may be formed of an integrated circuit. This integrated circuit includes, for example, an ASIC (Application Specific Integrated Circuit) or an FPGA (Field Programmable Gate Array).

Each of the wires H1 to HN is electrically connected to the switching section 14. Specifically, as shown in FIG. 4, the wire Hn is electrically connected to the switching section 14 through the pad electrode 22, a bonding wire 24 and a wire 25 on the mounting board 12. Although in FIG. 4, one bonding wire 24 and one wire 25 are shown, a plurality of bonding wires 24 and a plurality of wires 25 for electrically connecting the wires H1 to HN to the switching section 14 are provided. The switching section 14 applies the bias voltage through the wires H1 to HN to the respective columns of the cell groups of the first to the N-th columns.

Each of the wires R1 to RM is electrically connected to the reading section 15. Specifically, as shown in FIG. 5, the wire Rm is electrically connected to the reading section 15 through the pad electrode 23, a bonding wire 26, a wire 27 within the mounting board 12, and a bonding wire 28. Although in FIG. 5, one bonding wire 26, one bonding wire 28, and one wire 27 are shown, a plurality of bonding wires 26, a plurality of bonding wires 28, and a plurality of wires 27 for electrically connecting the wires R1 to RM to the reading section 15 are provided.

As shown in FIG. 6, the reading section 15 includes a resistor 31, a reading circuit 32, and a signal processing section 33. Each of the wires R1 to RM includes a quenching resistor 34. One or a plurality of avalanche photodiodes APD included in each of the cells U of the first to the N-th columns that constitute the cell group of the m-th row are electrically connected through the wire Rm to one end of the resistor 31. The avalanche photodiodes APD are electrically connected through the quenching resistors 34 to the one end of the resistor 31. The other end of the resistor 31 is connected to a GND (ground) potential. The one end of the resistor 31 is electrically connected to the reading circuit 32. In this way, a voltage drop in the resistor 31 is input to the reading circuit 32.

The reading circuit 32 includes a D/A converter (digital-analog conversion circuit) 35, a comparator 36, and a time measuring unit 37. The comparator 36 compares a reference voltage generated by the D/A converter 35 and the voltage drop in the resistor 31. Then, when the voltage drop in the resistor 31 exceeds the reference voltage, the comparator 36 outputs a signal to the time measuring unit 37. For example, a resistance value of the resistor 31 is set such that when the reflected light is incident on one of the cells U of the cell group of the m-th row and an output current (pulse) flows from the cell U described above to the resistor 31, the voltage drop in the resistor 31 exceeds the reference voltage. The time measuring unit 37 calculates a light projection period of the laser light based on a time at which the signal is input from the comparator 36. For example, information indicating a time at which the laser light is projected is input to the time measuring unit 37 from the controller of the light projecting unit 2.

The time measuring unit 37 outputs, to the signal processing section 33, time information indicating the light projection period of the laser light that is calculated. When it is not necessary to measure the light projection period of the laser light due to the application of the photodetection device 1, the reading circuit 32 may measure, for example, the amount of incident light. As described above, the reading section 15 of the controller 13 reads the signal corresponding to the reflected light. Although in FIG. 6, the single reading circuit 32 is shown, in the reading section 15, M reading circuits 32 are respectively provided for each of the rows of the cell groups of the first to the M-th rows. Each of the M reading circuits 32 outputs the signal to the signal processing section 33. The signal processing section 33 (light receiving unit 4) outputs, for example, a light reception signal based on the signal output by the reading circuit 32.

Figure 7:
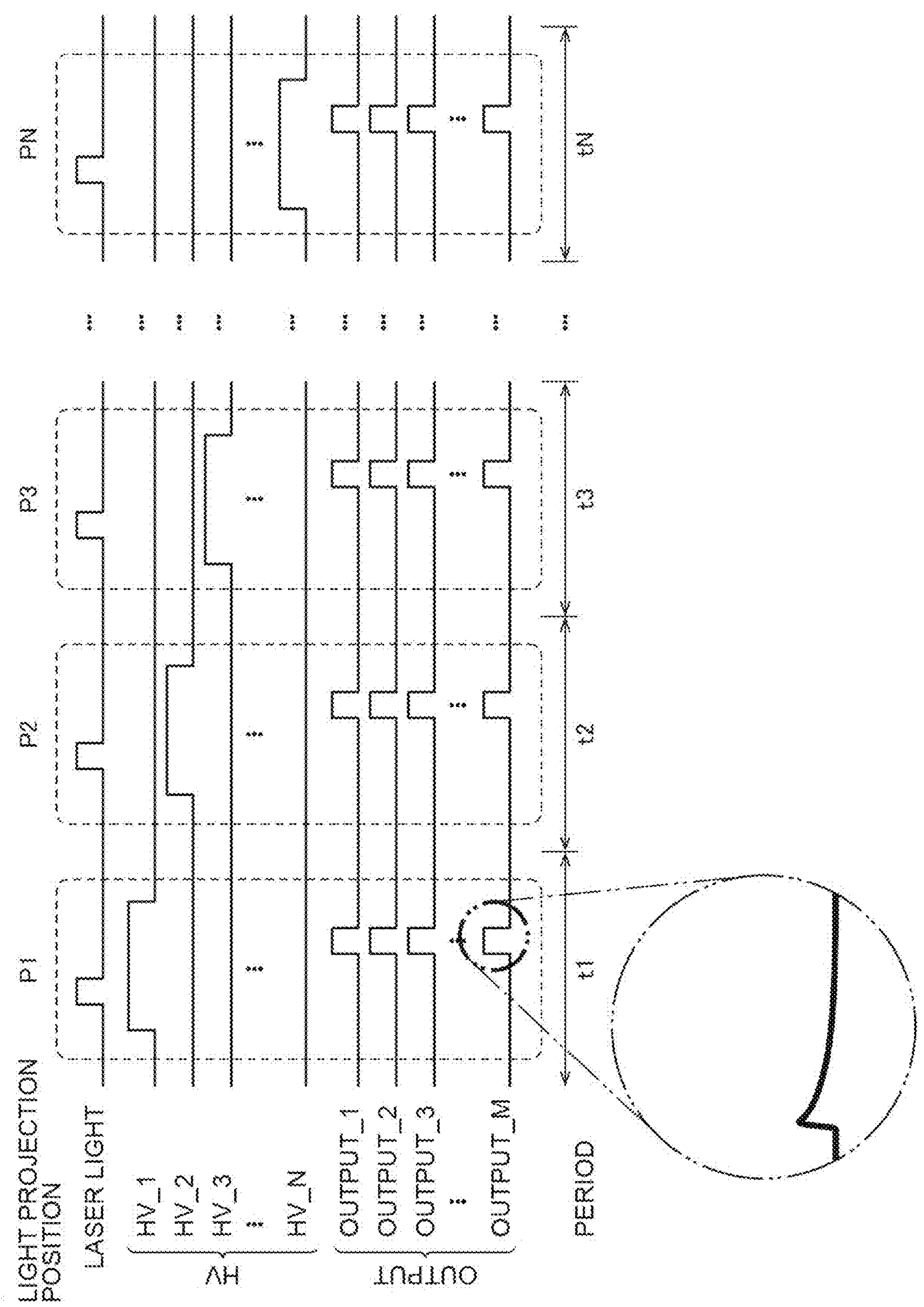
FIG. 7 is a timing chart of various signals in the photodetection device.

The operation of the photodetection device 1 will next be described with reference to FIG. 7. FIG. 7 is a timing chart of various signals in the photodetection device. FIG. 7 shows control timings by the light projecting unit 2 and the light receiving unit 4 in periods t1 to tN. Waveforms represented by "HV_1" to "HV_N" indicate timings at which bias voltages are applied by the switching section 14, and respectively correspond to the bias voltages that are applied to the cell groups of the first to the N-th columns. Waveforms represented by "OUTPUT_1" to "OUTPUT_M" indicate voltage signals generated in the resistor 31, and respectively correspond to signals from the cell groups of the first to the M-th rows.

In period t1, the controller of the light projecting unit 2 makes the light projecting unit 2 project the laser light toward the light projection position P1 at a predetermined timing. In FIG. 7, the width of a pulse in the waveform shown by the "laser light" indicates a time during which the laser light is projected. Before a time at which the projection of the laser light toward the light projection position P1 is started, the switching section 14 of the light receiving unit 4 starts the application of the bias voltage to the cell group of the first column through the wire H1. The switching section 14 continues to apply the bias voltage to the cell group of the first column until a predetermined time elapses after a time at which the projection of the laser light toward the light projection position P1 is terminated. While the bias voltage is applied to the cell group of the first column, the avalanche photodiodes APD included in the cell group of the first column operate in the Geiger mode. In other words, while the bias voltage is applied to the cell group of the first column, when the reflected light is incident on the cell group of the first column, the current signal corresponding to the reflected light is generated in each of the avalanche photodiodes APD within the cells U of the first to the M-th rows in the cell group of the first column.

The switching section 14 receives, from the controller of the light projecting unit 2, information indicating the light projection position and the light projection period (the time at which the light projection is started and the time at which the light projection is terminated), and applies the bias voltage to the cell group of the first column in accordance with an incident timing at which the reflected light is incident on the cell group of the first column. When the current signal corresponding to the reflected light is generated in each of the cells U of the first to the M-th rows in the cell group of the first column, the current signals flow through the wires R1 to RM to the resistors 31 described above. Then, the current signals are converted into voltage signals, and the respective voltage signals are output to the reading circuits 32. Then, the reading section 15 of the controller 13 reads the signals corresponding to the reflected light incident on the cells U of the first to the M-th rows in the cell group of the first column. The waveforms represented by "OUTPUT_1" to "OUTPUT_M" are respectively indicated by rectangular pulses. The voltage signal generated in the resistor 31 may be a pulse in which, as shown in an enlarged view included in FIG. 7, the voltage is rapidly increased at an initial stage and is thereafter gradually decreased.

When the detection (the reading of the signal) of the reflected light of the laser light applied toward the light projection position P1 is terminated, control in period t2 is started. In period t2, the controller of the light projecting unit 2 makes the light projecting unit 2 project the laser light toward the light projection position P2 at a predetermined timing. Before a time at which the projection of the laser light toward the light projection position P2 is started, the switching section 14 starts the application of the bias voltage to the cell group of the second column through the wire H2. The switching section 14 continues to apply the bias voltage to the cell group of the second column until a predetermined time elapses after a time at which the projection of the laser light toward the light projection position P2 is terminated. While the bias voltage is applied to the cell group of the second column, the avalanche photodiodes APD included in the cell group of the second column operate in the Geiger mode. In other words, while the bias voltage is applied to the cell group of the second column, when the reflected light is incident on the cell group of the second column, the current signal corresponding to the reflected light is generated in each of the avalanche photodiodes APD within the cells U of the first to the M-th rows in the cell group of the second column. The switching section 14 applies the bias voltage to the cell group of the second column in accordance with an incident timing at which the reflected light is incident on the cell group of the second column.

When the current signal corresponding to the reflected light is generated in each of the cells U of the first to the M-th rows in the cell group of the second column, the current signals flow through the wires R1 to RM to the resistors 31 described above. Then, the current signals are converted into voltage signals, and the voltage signals are respectively output to the reading circuits 32. Then, the reading section 15 of the light receiving unit 4 reads the signals corresponding to the reflected light incident on the cells U of the first to the M-th rows in the cell group of the second column. In period t1 and period t2, the wire H1 and the wire H2 different from each other are used, and the bias voltage is applied to each of the cell group of the first column and the cell group of the second column. On the other hand, in period t1 and period t2, the wires R1 to RM are used in common, and the signals are read from the cells U of the first to the M-th rows included in the cell group of the first column and the cell group of the second column.

Thereafter, the controller of the light projecting unit 2, the switching section 14 and the reading section 15 sequentially perform, in periods t3 to tN, the same control as in period t1 and period t2. The switching section 14 applies, in accordance with the light projection position of the laser light, the bias voltage to a cell group located in a different column through the wire Hn that is any one of the wires H1 to HN. The reading section 15 reads, regardless of the light projection position of the laser light, the signals corresponding to the reflected light incident on the cells U of the first to the M-th rows included in the cell group to which the bias voltage is applied. As described above, in a method for driving the semiconductor photodetection element 11 by the controller 13, the bias voltage is applied to the cell groups of the first to the N-th columns at different timings for each of the columns. The switching section 14 may start the application of the bias voltage to the cell group of the n-th column through the wire Hn after a predetermined time has elapsed since the time at which the light projection of the laser light was started. For example, when dirt or the like is adhered to a cover (transparent window) that is provided in a housing storing the photodetection device 1 and that transmits the laser light, unintended reflected light may be incident on the light receiving unit 4 from a very short distance. The application of the bias voltage is started after the predetermined time has elapsed since the time at which the light projection of the laser light was started, and thus the detection of the unintended reflected light as described above is reduced.

After the laser light is projected by the light projecting unit 2 up to the light projection position PN, the photodetection device 1 may repeat, in the detection target region S, the scanning of the laser light to read the signals corresponding to the reflected light. For example, after the laser light is projected up to the light projection position PN, the light projecting unit 2 of the photodetection device 1 may sequentially project the laser light from the light projection position P1 to the light projection position PN again or may sequentially project the laser light from the light projection position PN to the light projection position P1.

As described above, in the photodetection device 1, the light projecting unit 2 scans, along the direction D2, the laser light having a cross-sectional shape whose longitudinal direction corresponds to the direction D1, and thus in the semiconductor photodetection element 11, the reflected light is incident on each of the cell groups of the first to the N-th columns. The controller 13 applies, in accordance with the incidence of the reflected light, the bias voltage to each of the cell groups of the first to the N-th columns. Hence, the wires for applying the bias voltage to the cells U may be respectively provided for each of the cell groups of the first to the N-th columns, and may be electrically connected to the avalanche photodiodes APD within the cells U included in the corresponding cell group. The controller 13 reads signals from the M cells U included in one of the cell groups of the first to the N-th columns to which the bias voltage is applied. Hence, the wires for reading signals from the cells U may be respectively provided for each of the M cell groups each of which includes the N cells U aligned in the row direction, and may be electrically connected to the avalanche photodiodes APD within the cells U included in the corresponding cell group of the M cell groups. Consequently, in the photodetection device 1 of the present embodiment, the configuration of the wire that applies the bias voltage to each of the avalanche photodiodes APD and the wire that reads a signal from each of the cells U can be simplified.

As the configuration of a photodetection device for reading a signal from each of the cells in a semiconductor photodetection element, a configuration can be considered in which wires and the like for simultaneously applying bias voltages to all the cells arrayed in a semiconductor substrate are provided. In this configuration, a plurality of switches are provided in a plurality of wires for reading that are respectively provided for each of the rows of the cells. In the photodetection device including the configuration described above, the switches are respectively provided for the respective cells, the opened/closed state of the switch is switched and thus a specific cell is electrically continuous with the wiring for reading, with the result that a signal from the specific cell is read. In contrast to the photodetection device including the configuration as described above, in the photodetection device 1 of the present embodiment, not only the cell U to which the bias voltage is being applied but also the cells U to which the bias voltage is not being applied are electrically connected to a plurality of wires that are provided for reading. Hence, the controller 13 also reads signals from the cells U to which the bias voltage is not applied. Since the signal output from the avalanche photodiodes APD within the cells U to which the bias voltage is not applied are extremely small, the influence of that signal exerted on the entire signal to be read through the wire provided for reading is extremely small. Thus, for reading signal from the specific cell, switches do not need to be provided in the wire provided for reading. Hence, as compared with the case where the switches are provided in the wires for reading, in the photodetection device 1, the influence of noise generated in association with the capacity of the switches and the opening/closing operation of the switches on the signals read from the wires provided for reading is reduced.

The photodetection device described above that includes the wires for simultaneously applying the bias voltages and the plurality of switches may have problems as described below. In the configuration in which the signal is read from a specific cell by switching the switch from the opened state to the closed state, when light (photons) is incident on the specific cell immediately before the switching of the switch to the closed state, the signal read from the specific cell may include a signal of the light that is incident immediately before the switching of the switch to the closed state. The signal of the light that is incident immediately before the switching of the switch to the closed state is an unnecessary output. By contrast, a signal of light that is incident after the switching of the switch to the closed state is a necessary output.

In the photodetection device 1, even when light is incident on the cell in a state where the bias voltage is not applied, a signal output from that cell is extremely small, with the result that an unnecessary output is unlikely to be included in the signal read from the cell.

In the photodetection device 1, signals are output, at substantially the same timing, from the M cells U included in the cell group of the n-th column to which the bias voltage for making the avalanche photodiodes APD operate in the Geiger mode is applied. Specifically, among the M cells U included in the cell group of the n-th column, cells that are adjacent to each other are separated by the trench 21, the wires are respectively provided for each of the rows and thus it is possible to read a signal from each of the M cells U. Hence, the signals from the M cells U included in the cell group of the n-th column are output simultaneously at substantially the same timing. Consequently, signals corresponding to the reflected light incident on the light receiving unit are read at high speed.

The bias voltage is applied in accordance with the incidence of the reflected light, and thus the cell group to be read is determined. Since as described above, the influence of signals from the cells U to which the bias voltage is not applied is extremely small, even when the reflected light is incident on cell groups adjacent to the cell group to be read, the influence on signals that are read is small. Hence, the range in which the reflected light is incident does not need to be strictly matched to the cell group to be read, and thus it is easy to adjust the cross-sectional shape of the laser light. For example, this configuration is effective when it is difficult to match the range in which the reflected light is incident thereto only by optical adjustment.

In the photodetection device 1, the controller 13 applies, in accordance with the incidence of the reflected light, for each corresponding cell group of the cell groups of the first to the N-th columns, the bias voltage to the avalanche photodiodes APD within the cells U included in each corresponding cell group through the wires H1 to HN that are respectively provided for each of the columns of the cell groups of the first to the N-th columns. The controller 13 reads, for each corresponding cell group of the cell groups of the first to the M-th rows, signals from the avalanche photodiodes APD within the cells U included in each corresponding cell group through the wires R1 to RM that are respectively provided for each of the rows of the cell groups of the first to the M-th rows. Hence, in the photodetection device 1, the configuration of the wires H1 to HN and the wires R1 to RM is simplified. Patent Literature 1 described previously neither discloses nor suggests the specific configuration of a wire for applying a bias voltage to each of the photodiodes and a wire for reading a signal.

The avalanche photodiode APD performs avalanche multiplication by the application of the bias voltage. Hence, photoelectrons generated by the incidence of light are multiplied, and thus the avalanche photodiode APD outputs a signal (current signal) caused by the multiplied photoelectrons. Even in the avalanche photodiode APD to which the bias voltage is not applied, photoelectrons are generated by the incidence of light. A signal output from the avalanche photodiode APD to which the bias voltage is not applied is extremely small as compared with the signal output from the avalanche photodiode APD to which the bias voltage is applied.

In the photodetection device 1, not only the cells U to which the bias voltage is being applied but also the cells U to which the bias voltage is not being applied are electrically connected to the wires R1 to RM. Hence, the controller 13 also reads signals from the cells U to which the bias voltage is not applied. As described above, the signal output from the avalanche photodiode APD within the cell U to which the bias voltage is not applied is extremely small, and thus the influence of the signal described above on the entire signals to be read through the wires R1 to RM is extremely small. Consequently, the detection accuracy in the photodetection device 1 is enhanced.

In the photodetection device 1, among the cell groups of the first to the N-th columns, cell groups that are adjacent to each other are electrically separated by the trench 21. Hence, when the bias voltage is applied to the cells U included in the cell group of the n-th column, the bias voltage is unlikely to be applied to the cells U included in the cell group of the (n−1)th column and the cell group of the (n+1)th column that are adjacent in the row direction to the cell group of the n-th column. Consequently, the cell groups of the (n−1)th column and the (n+1)th column that are adjacent in the row direction to the cell group of the n-th column are unlikely to perform avalanche multiplication.

In the photodetection device 1, the respective cells U are electrically separated by the trench 21. Hence, when the bias voltage is applied to the M cells included in the cell group of the n-th column, among the M cells included in the cell group of the n-th column, electrical crosstalk occurring between signals generated in the cells U adjacent to each other is reduced. Consequently, the detection accuracy in the photodetection device 1 is enhanced.

Figure 8:
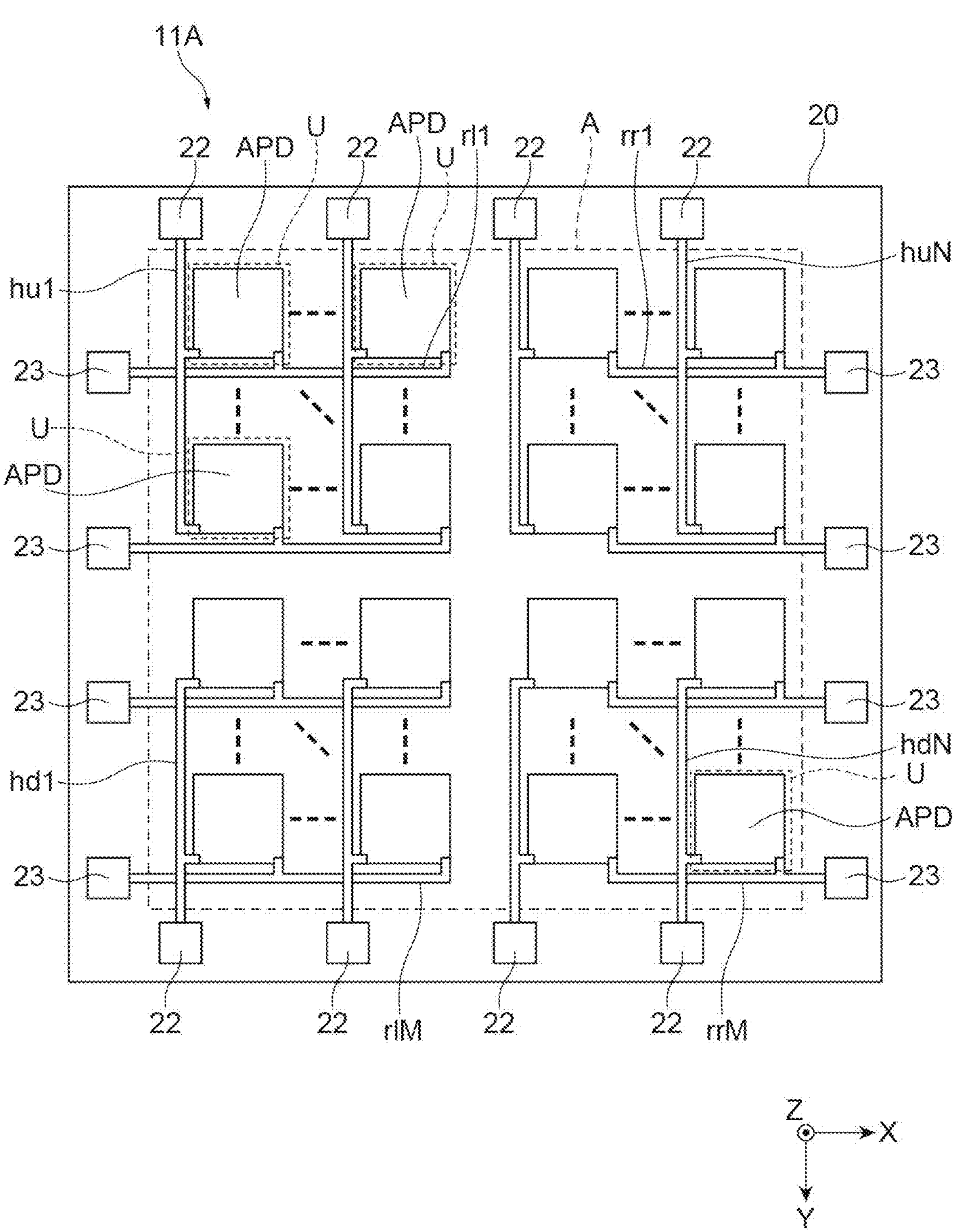
FIG. 8 is a schematic plan view of a semiconductor photodetection element according to a modification example.

A semiconductor photodetection element 11A according to a modification example in the photodetection device 1 of the present embodiment will next be described. FIG. 8 is a schematic plan view of the semiconductor photodetection element according to the modification example. The semiconductor photodetection element 11A shown in FIG. 8 differs from the semiconductor photodetection element 11 shown in FIG. 3 in the following points. The wires H1 to HN include a plurality of branch wires hu1 to huN and a plurality of branch wires hd1 to hdN. The wires R1 to RM include a plurality of branch wires rl1 to rlM and a plurality of branch wires rr1 to rrM. The pad electrodes 22 are provided on both outer sides of the light receiving region A in the Y axis direction on the XY axis plane. The pad electrodes 23 are provided on both outer sides of the light receiving region A in the X axis direction on the XY axis plane.

In the semiconductor photodetection element 11A, a wire Hn that is located in the n-th position includes a branch wire hun that is located in the n-th position among the branch wires hu1 to huN and a branch wire hdn that is located in the n-th position among the branch wires hd1 to hdN. In the present embodiment, the branch wire hun is electrically connected to the cells U of the first to the (M/2)th rows included in the cell group of the n-th column, and the branch wire hdn is electrically connected to the cells U of the (M/2+1)th to the M-th rows included in the cell group of the n-th column. The number of cells U that are connected to the branch wire hun and the number of cells U that are connected to the branch wire hdn do not need to be equal to each other. The branch wire hun may be connected to the cells U of the first to the j-th rows in the cell group of the n-th column and the branch wire hdn may be connected to the cells U of the (j+1)th to the M-th rows in the cell group of the n-th column. j is an integer of 2 to (M−2). In this case, M may be an integer equal to or greater than 4. In the semiconductor photodetection element 11A, the bias voltage is applied to the cell group of the n-th column through the branch wire hun and the branch wire hdn. For example, the branch wires hu1 to huN form first branch wires, and the branch wires hd1 to hdN form second branch wires.

In the semiconductor photodetection element 11A, a wire Rm that is located in the m-th position includes a branch wire rlm that is located in the m-th position among the branch wires rl1 to rlM and a branch wire rrm that is located in the m-th position among the branch wires rr1 to rrM. In the present embodiment, the branch wire rlm is electrically connected to the cells U of the first to the (N/2)th columns included in the cell group of the m-th row, and the branch wire rrm is electrically connected to the cells U of the (N/2+1)th to the N-th columns. The number of cells U that are connected to the branch wire rlm and the number of cells U that are connected to the branch wire rrm do not need to be equal to each other. The branch wire rlm may be connected to the cells U of the first to the k-th columns included in the cell group of the m-th row, and the branch wire rrm may be connected to the cells U of the (k+1)th to the N-th columns included in the cell group of the m-th row. k is an integer of 2 to (N−2). In this case, N may be an integer equal to or greater than 4. A current signal generated in each of the cells U is output to the resistor 31 through either of the branch wire rlm and the branch wire rrm. In this case, the branch wire rlm and the branch wire rrm may be connected to the same reading circuit 32 or may be respectively connected to different reading circuits 32. The branch wire rlm and the branch wire rrm may be connected to the same resistor 31 or may be respectively connected to different resistors 31. For example, the branch wires rl1 to rlM form a third branch wires, and the branch wires rr1 to rrM form a fourth branch wires.

In the photodetection device 1 including the semiconductor photodetection element 11A according to the modification example as well, as in the photodetection device 1 including the semiconductor photodetection element 11, the configuration of the wires H1 to HN and the wires R1 to RM is simplified.

The branch wire hun is electrically connected to the cells U of the first to the (M/2)th rows included in the corresponding cell group of the n-th column. The branch wire hdn is electrically connected to the cells U of the (M/2+1)th to the M-th rows included in the corresponding cell group of the n-th column. When as in the semiconductor photodetection element 11, all the cells U included in the cell group of the n-th column are electrically connected to the one wire Hn, a difference between a wire distance up to the cell U of the M-th row located in one end of the column direction and a wire distance up to the cell U of the first row located in the other end of the column direction is large. When the difference between the wire distances up to the cells U is large, a difference between the timings at which the bias voltage is applied to the cells U is also large. In the semiconductor photodetection element 11A, the difference between the wire distances up to the cells U is small as compared with the semiconductor photodetection element 11 in which all the cells U included in the cell group of the n-th column are electrically connected to the one wire Hn. Hence, the difference between the timings at which the bias voltage is applied to the cells U is small.

The branch wire rlm is electrically connected to the cells U of the first to the (N/2)th columns included in the corresponding cell group of the m-th row. The branch wire rrm is electrically connected to the cells U of the (N/2+1)th to the N-th columns included in the corresponding cell group of the m-th row. When as in the semiconductor photodetection element 11, all the cells U included in the cell group of the m-th row are electrically connected to the one wire Rm, a difference between a wire distance from the cell U of the N-th column located in one end of the row direction and a wire distance from the cell U of the first column located in the other end of the row direction is large. When the wire distances from the cells U are long, noise may be included in signals read through the wires R1 to RM due to the influence of parasitic capacitance generated in the wires R1 to RM and the like. In the semiconductor photodetection element 11A, the wire distances from the cells U are short as compared with a case where all the cells U included in the cell group of the m-th row are electrically connected to the one wire Rm. Hence, noise is unlikely to be included in the signals read through the wires R1 to RM. Consequently, a decrease in the detection accuracy in the photodetection device 1 is reduced.

Figure 9:
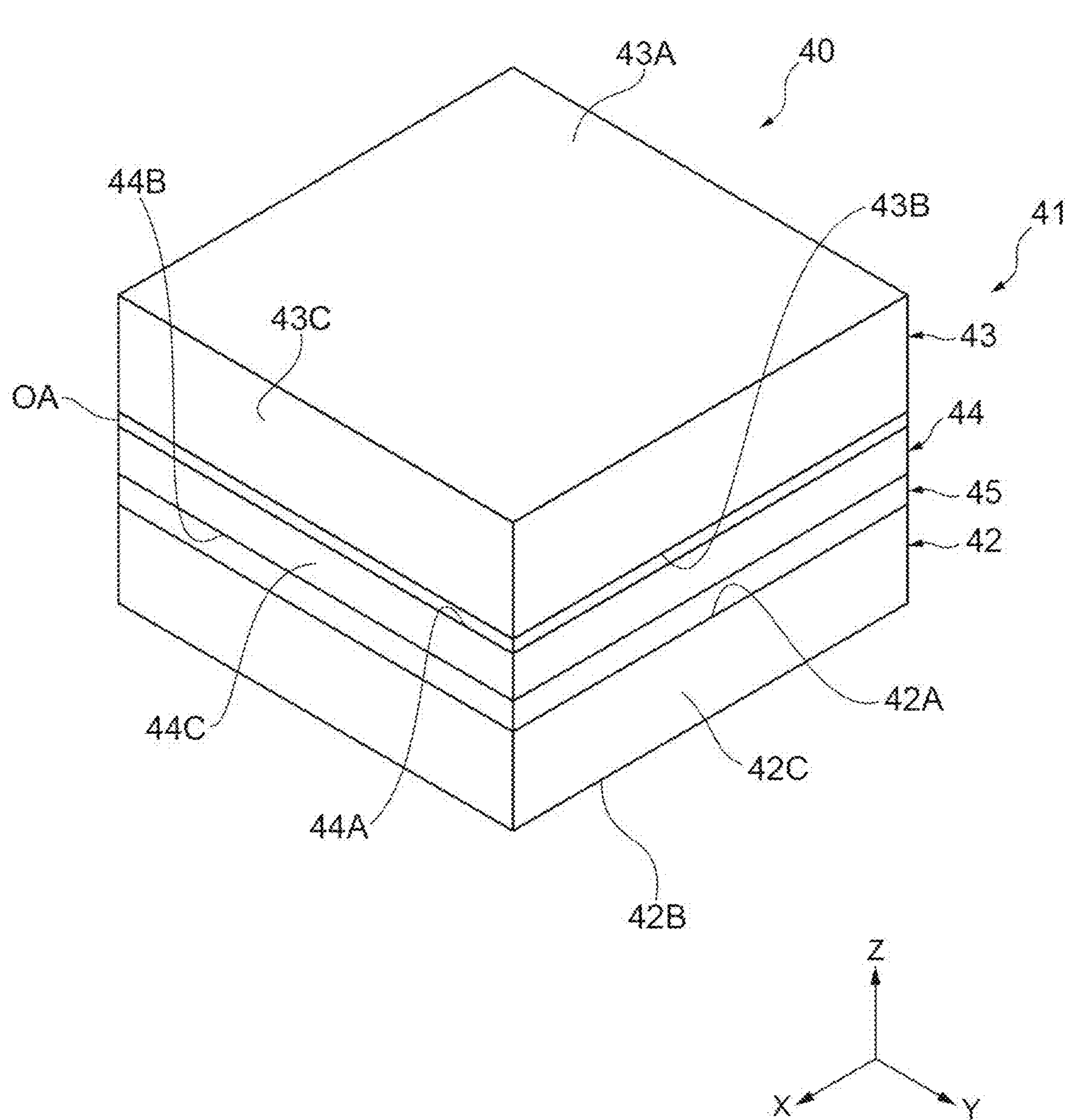
FIG. 9 is a perspective view of a light receiving unit included in a photodetection device according to a second embodiment.
Figure 10:
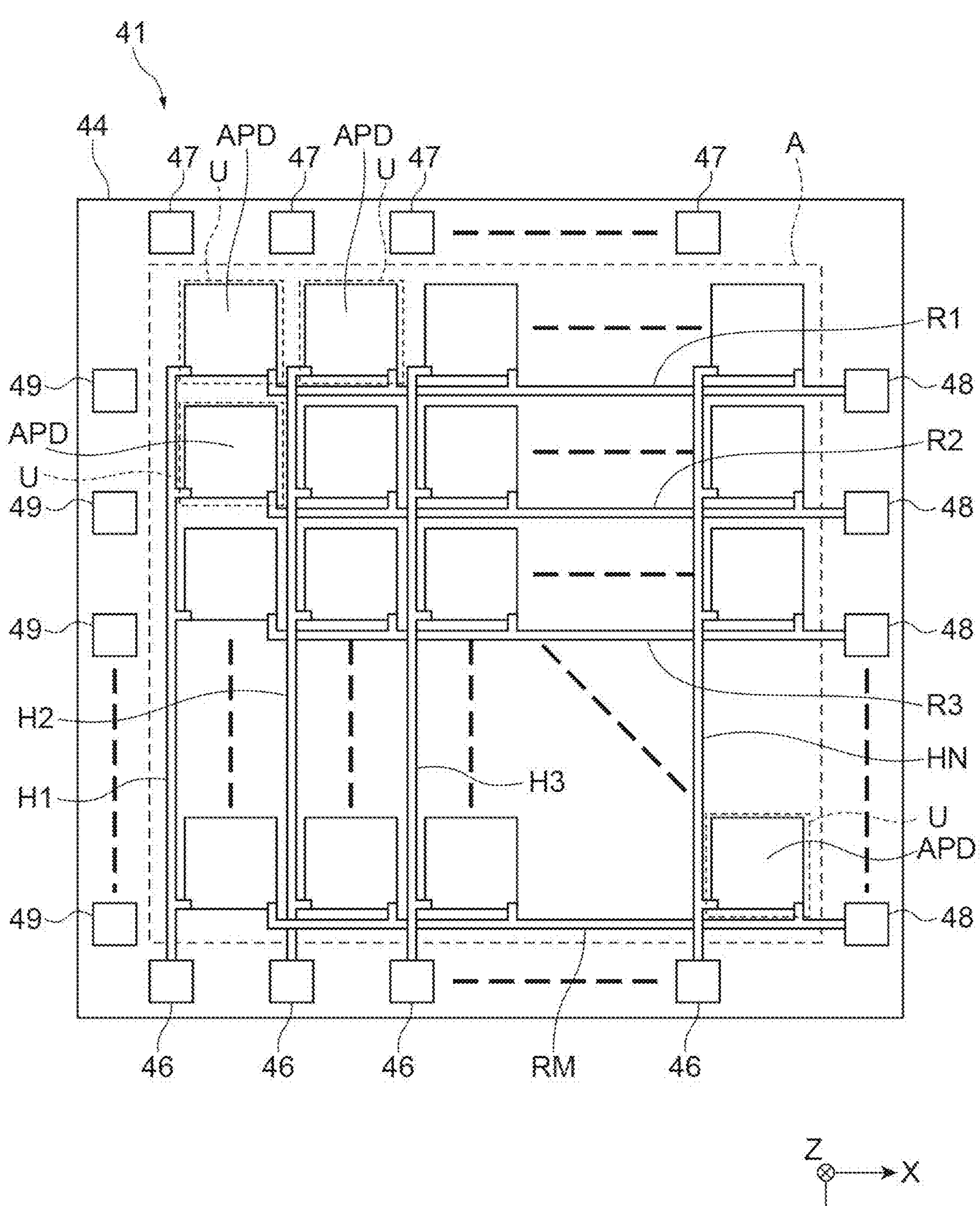
FIG. 10 is a schematic plan view of a semiconductor photodetection element.
Figure 11:
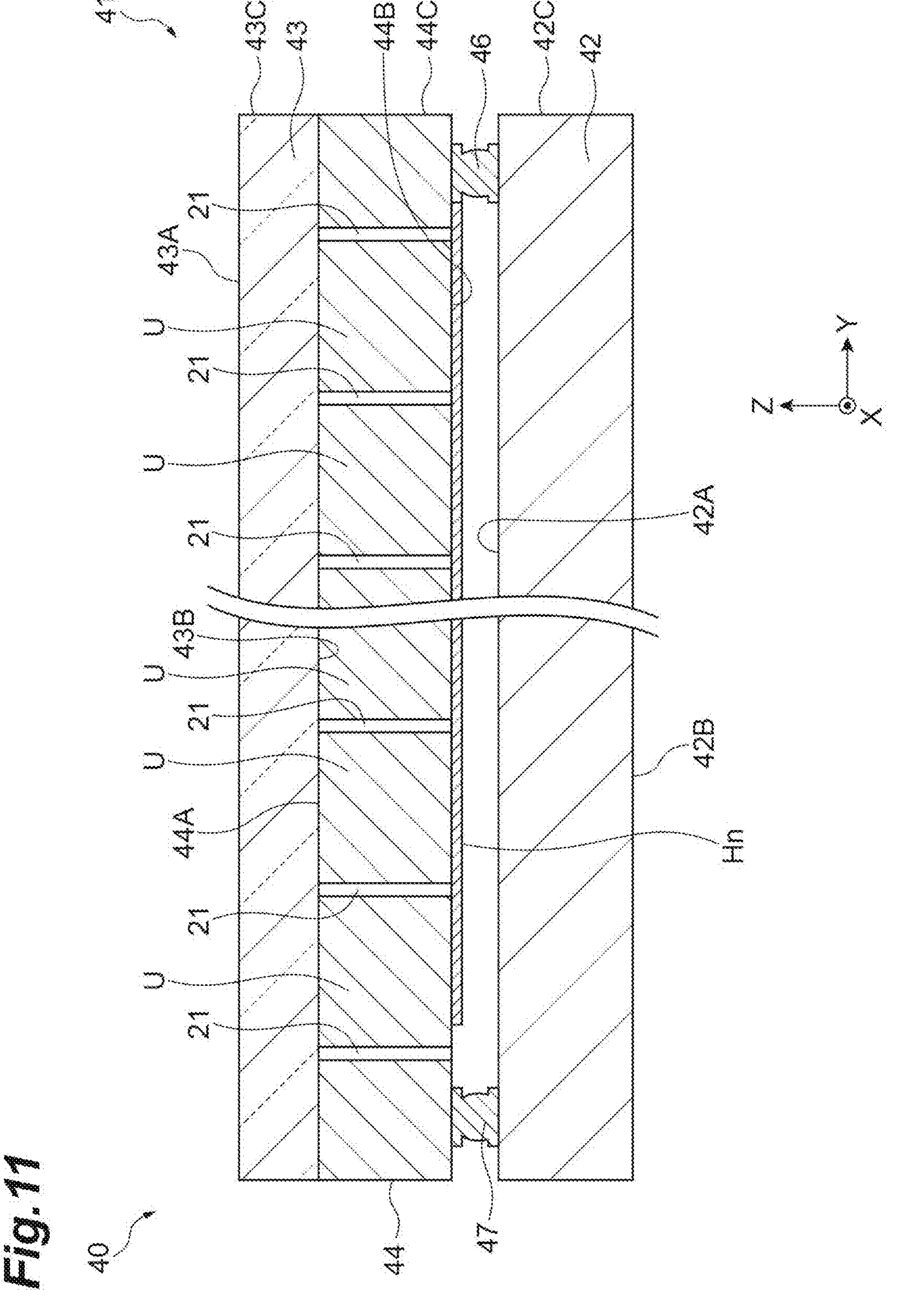
FIG. 11 is a schematic view showing a sectional configuration of a light receiving unit.
Figure 12:
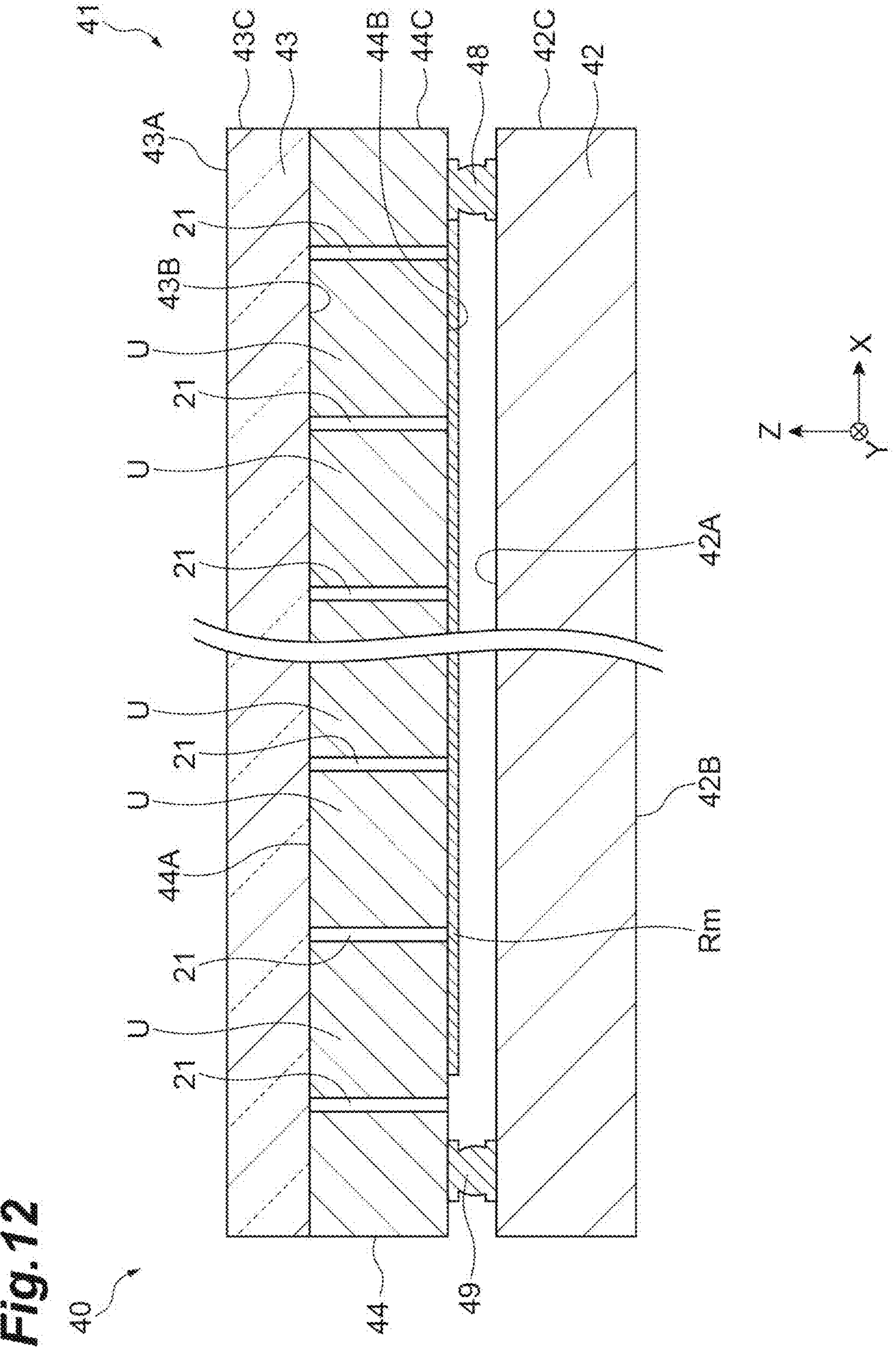
FIG. 12 is a schematic view showing a sectional configuration of the light receiving unit.
Figure 13:
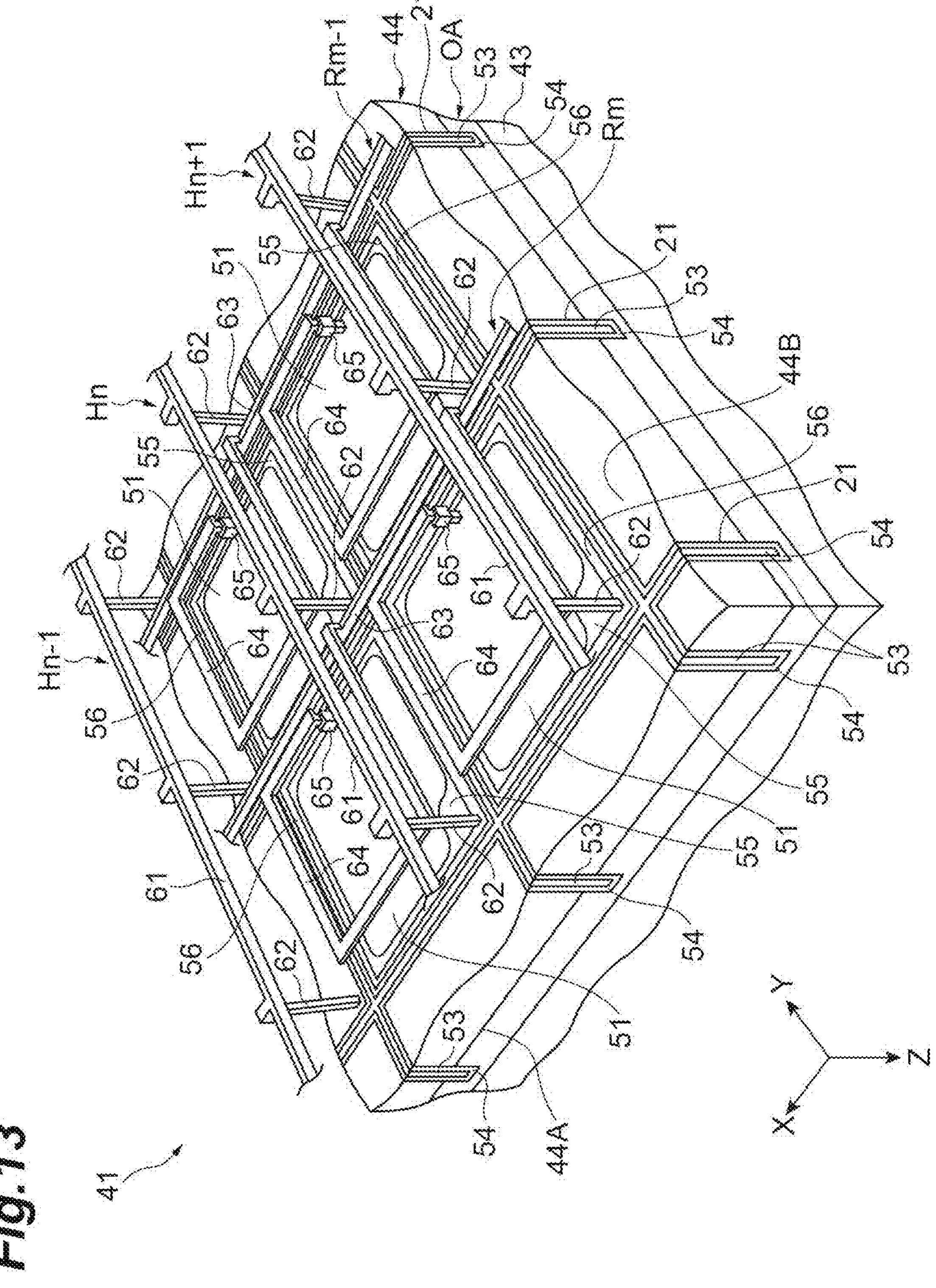
FIG. 13 is a perspective view showing an example of the wiring form of the semiconductor photodetection element.
Figure 14:
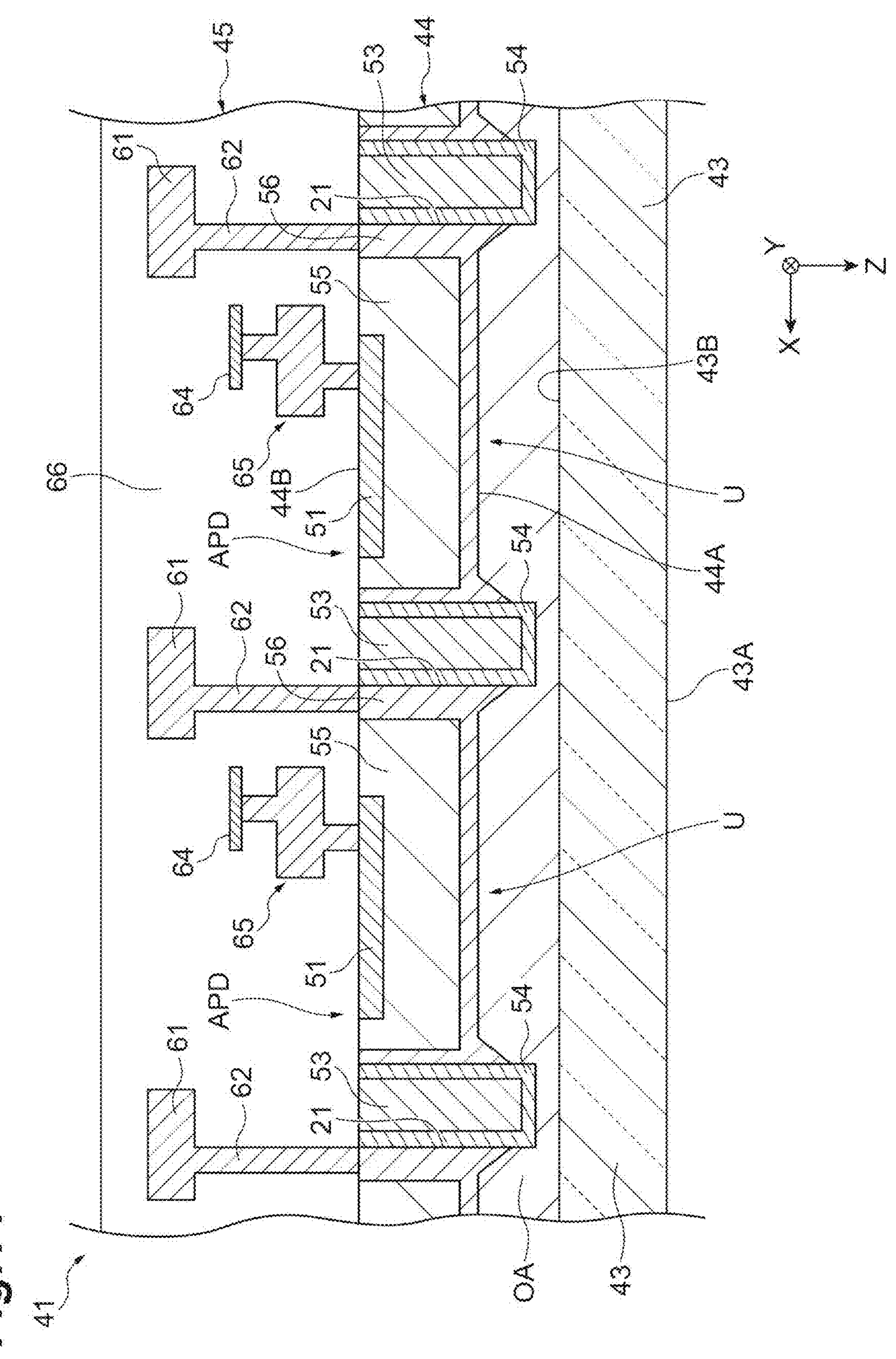
FIG. 14 is a diagram showing a sectional configuration of the semiconductor photodetection element.

A light receiving unit 40 included in a photodetection device according to a second embodiment will next be described with reference to FIGS. 9 to 14. FIG. 9 is a perspective view of the light receiving unit included in the photodetection device according to the second embodiment. FIG. 10 is a schematic plan view of a semiconductor photodetection element. FIG. 11 is a schematic view showing a sectional configuration of the light receiving unit. FIG. 12 is a schematic view showing a sectional configuration of the light receiving unit. FIG. 13 is a perspective view showing an example of the wiring form of the semiconductor photodetection element. FIG. 14 is a diagram showing a sectional configuration of the semiconductor photodetection element.

As shown in FIG. 9, the light receiving unit 40 includes the semiconductor photodetection element 41 and a circuit board 42. The semiconductor photodetection element 41 includes a glass substrate 43, a semiconductor substrate 44, and a wiring layer 45. The circuit board 42, the wiring layer 45, the semiconductor substrate 44, and the glass substrate 43 are disposed in this order in the Z axis direction. In the present embodiment, the circuit board 42, the glass substrate 43, the semiconductor substrate 44, and the wiring layer 4 have rectangular shapes in plan view.

The glass substrate 43 is made of a transparent glass material that transmits light. The glass substrate 43 has a main surface 43A and a main surface 43B that oppose each other, and side surfaces 43C. The main surface 43A and the main surface 43B are flat surfaces. The glass substrate 43 is adhered to the semiconductor substrate 44 by an optical adhesive OA. The glass substrate 43 may be formed directly on the semiconductor substrate 44. The semiconductor photodetection element 41 is, for example, a semiconductor photodetection element of a backside incident type.

The semiconductor substrate 44 is made of Si (silicon), and is a semiconductor substrate whose conductivity type is p-type. The semiconductor substrate 44 has a main surface 44A and a main surface 44B that oppose each other, and side surfaces 44C. The main surface 44A of the semiconductor substrate 44 and the main surface 43B of the glass substrate 43 oppose each other through the optical adhesive OA. The main surface 44A is a surface on which light to the semiconductor substrate 44 is incident. In the present embodiment, reflected light passes through the glass substrate 43 to be incident on the semiconductor substrate 44. The wiring layer 45 is disposed between the semiconductor substrate 44 and the circuit board 42. For example, when the main surface 44A forms a first main surface, the main surface 44B forms a second main surface.

The circuit board 42 has a main surface 42A and a main surface 42B that oppose each other, and side surfaces 42C. The main surface 42A of the circuit board 42 and the main surface 44B of the semiconductor substrate 44 oppose each other through the wiring layer 45. In the present embodiment, the side surface 42C of the circuit board 42, the side surface 44C of the semiconductor substrate 44, and the side surface 43C of the glass substrate 43 are flush with each other. In other words, in plan view, outer edges of the circuit board 42, the semiconductor substrate 44, and the glass substrate 43 coincide with each other. The respective outer edges of the circuit board 42, the semiconductor substrate 44, and the glass substrate 43 do not need to coincide with each other. For example, in plan view, an area of the circuit board 42 may be larger than the respective areas of the semiconductor substrate 44 and the glass substrate 43. In this case, the side surface 42C of the circuit board 42 is located outward on the XY axis plane with respect to the side surface 44C of the semiconductor substrate 44 and the side surface 43C of the glass substrate 43.

The circuit board 42 forms an ASIC. The ASIC of the circuit board 42 includes a switching section and a reading section. The switching section applies a bias voltage to each of the columns of the cell groups of the first to the N-th columns. The reading section includes reading circuits that read signals from the respective rows of the cell groups of the first to the M-th rows. For example, the switching section and the reading section within the ASIC form a controller.

As shown in FIG. 10, in plan view, the semiconductor substrate 44 includes a plurality of cells U that are arrayed two-dimensionally in M rows and N columns. In the semiconductor substrate 44, a signal corresponding to reflected light detected in each of the cells U is output from the cell U. The number of cells U is, for example, "1024 (32 rows×32 columns)". In the present embodiment, each of the cells U includes one avalanche photodiode APD. Each of the cells U may include a plurality of avalanche photodiodes APD. In the semiconductor substrate 44, a light receiving region A is formed that surrounds the cells U arrayed two-dimensionally. In FIG. 10, the illustration of an insulating layer 66 forming the wiring layer 45 is omitted.

As shown in FIGS. 11 and 12, a trench 21 is formed in the semiconductor substrate 44. The trench 21 opens in the main surface 44A and the main surface 44B. In other words, the trench 21 penetrates the semiconductor substrate 44 in a direction (Z axis direction) in which the main surface 44A and the main surface 44B oppose each other. The trench 21 separates, among the cells U, cells U that are adjacent to each other. Specifically, the trench 21 surrounds each of the cells U when viewed in a direction (Z axis direction) orthogonal to the main surface 44A.

The wiring layer 45 of the semiconductor photodetection element 41 includes a plurality of wires H1 to HN and a plurality of wires R1 to RM as in the semiconductor photodetection element 11. The wires H1 to HN are respectively provided for each of the columns of the cell groups of the first to the N-th columns included in the cells U. The wires R1 to RM are respectively provided for each of the rows of the cell groups of the first to the M-th rows included in the cells U. The wires H1 to HN and the wires R1 to RM in the semiconductor photodetection element 41 have the same configuration as in the semiconductor photodetection element 11 except that they are disposed on the main surface 41B of the semiconductor photodetection element 41, that is, the main surface close to the circuit board.

The semiconductor photodetection element 41 includes a plurality of bump electrodes 46 (N bump electrodes 46), a plurality of bump electrodes 47 (N bump electrodes 47), a plurality of bump electrodes 48 (M bump electrodes 48), and a plurality of bump electrodes 49 (M bump electrodes 49). The wires H1 to HN are electrically connected to the bump electrodes 46. The bump electrodes 47 are provided in positions that correspond to the bump electrodes 46 in the X axis direction, and no wires are connected to the bump electrodes 47. The wires R1 to RM are electrically connected to the bump electrodes 48. The bump electrodes 49 are provided in positions that correspond to the bump electrodes 47 in the Y axis direction, and no wires are connected to the bump electrodes 49. The bump electrodes 47 and the bump electrodes 49 are dummy bump electrodes, and serve to prevent the semiconductor substrate 44 from inclining with respect to the circuit board 42.

Each of the wires H1 to HN is electrically connected to the circuit board 42. As shown in FIG. 11, a wire Hn is provided at the main surface 44B of the semiconductor substrate 44. Here, the wire Hn is disposed on the main surface 44B. The wire Hn is electrically connected to the switching section within the circuit board 42. Each of the wires R1 to RM is electrically connected to the circuit board 42. As shown in FIG. 12, a wire Rm is provided on the main surface 44B of the semiconductor substrate 44. Here, the wire Rm is disposed on the main surface 44B. The wire Rm is electrically connected to the reading section within the circuit board 42.

An example of the wiring form of the wires H1 to HN and the wires R1 to RM will next be described. In FIG. 13, a perspective view of the semiconductor substrate 44 in which the insulating layer 66 forming the wiring layer 45 is omitted is shown. The avalanche photodiode APD that forms the cell U includes an n-type conductivity semiconductor region 51 and a p-type conductivity semiconductor region 55. The semiconductor region 51 and the semiconductor region 55 form a pn junction of the avalanche photodiode APD. The avalanche photodiode APD further includes a semiconductor region 56 in order to lower contact resistance with wires connected to the avalanche photodiode APD. The impurity concentration of the semiconductor region 56 is higher than that of the semiconductor region 55.

The avalanche photodiodes APD adjacent to each other are separated by the trench 21. In other words, the trench 21 surrounds the semiconductor region 56 of each of the avalanche photodiodes APD when viewed in the Z axis direction. The interior of the trench 21 is filled with a light-shielding member 53. The light-shielding member 53 is made of a material that reflects light. The light-shielding member 53 may instead be made of a material that absorbs light without reflecting it. The material of which the light-shielding member 53 is made is, for example, tungsten. A portion of the light-shielding member 53 protrudes from the main surface 44A of the semiconductor substrate 44 and is located within the optical adhesive OA. The surfaces of the light-shielding member 53 other than the surface exposed from the main surface 44B are covered with an insulating film 54. For example, the side surfaces of a portion of the light-shielding member 53 located within the trench 21 and the surface of a portion of the light-shielding member 53 protruding from the main surface 44A are covered with the insulating film 54 that is integrally formed therewith. The insulating film 54 is located between the light-shielding member 53 and the semiconductor region 56. In this way, insulation between the semiconductor region 56 of the avalanche photodiode APD and the light-shielding member 53 can be enhanced.

The wire Hn includes a common wire 61 and a plurality of connection wires 62. The common wire 61 is disposed along a direction in which the cells U included in the cell group of the n-th column are aligned. The connection wires 62 electrically connect the common wire 61 and the semiconductor regions 56 of the avalanche photodiodes APD to each other. The common wire 61 and the connection wires 62 intersect each other when viewed in the X axis direction. The common wire 61 and the connection wires 62 are made of the same metal material and are made of, for example, aluminum. The common wire 61 and the connection wires 62 may be made of a metal material. Examples of the metal material include Cu (copper), Ti (titanium), Ni (nickel), Au (gold), and Pt (platinum).

The wire Rm includes a common wire 63, a plurality of quenching resistors 64, and a plurality of connection wires 65. The common wire 63 is disposed along a direction in which the cells U included in the cell group of the m-th row are aligned. The quenching resistors 64 are connected to the common wire 63. The connection wires 65 electrically connect the quenching resistors 64 and the semiconductor regions 51 to each other. The common wire 63 and the connection wires 65 intersect each other when viewed in the Y axis direction. The common wire 63 and the connection wires 65 are made of the same metal material and are made of, for example, aluminum. The common wire 63 and the connection wires 65 may be made of a metal material. Examples of the metal material include Cu (copper), Ti (titanium), Ni (nickel), Au (gold), and Pt (platinum). The quenching resistor 64 is disposed to be along a peripheral edge of the semiconductor region 51 when viewed in the Z axis direction. The quenching resistors 64 are made of, for example, SiCr (silicon chromium). The quenching resistors 64 may be made of polysilicon, NiCr (nickel chromium), or FeCr (ferrochrome).

In FIG. 14, an example of the sectional configuration of the semiconductor substrate 44 including the insulating layer 66 of the wiring layer 45 is shown. In FIG. 14, the sectional configuration of the insulating layer 66 is shown, and the hatching of the insulating layer 66 is omitted. The semiconductor region 55 surrounds a portion (side surfaces and a bottom surface) of the semiconductor region 51, and the semiconductor region 56 surrounds a portion (outer side surfaces and a bottom surface) of the semiconductor region 55. The common wire 61 of the wire Hn is electrically connected to the semiconductor region 56 through the connection wire 62. The common wire 63 of the wire Rm is electrically connected to the semiconductor region 51 through the quenching resistor 64 and the connection wire 65. For example, in the avalanche photodiode APD to which the bias voltage is applied, the semiconductor region 51 is a cathode, and the semiconductor region 56 is an anode. For example, when in the pn junction formed by the semiconductor region 51 and the semiconductor region 55, a depletion layer does not reach the semiconductor region 56 even if the bias voltage is applied, and when the bias voltage is not applied, the semiconductor region 51 is a cathode, and the semiconductor region 55 and the semiconductor region 56 are an anode. As shown in FIG. 14, the positions of the common wire 61 of the wire Hn, the quenching resistors 64 of the wire Rm, and the common wire 63 of the wire Rm in the Z axis direction are different from each other. In the present embodiment, the common wire 63, the quenching resistors 64, and the common wire 61 are disposed in this order from the main surface 44B of the semiconductor substrate 44. The sections of the common wire 61, the common wire 63, and the quenching resistors 64 are rectangular. For example, when the semiconductor region 55 and the semiconductor region 56 form an anode, the semiconductor region 51 forms a cathode.

As an example, the thickness of the common wire 61, that is, the length of the common wire 61 in the Z axis direction is approximately 600 nm, the thickness of the common wire 63 is approximately 600 nm, and the thickness of the quenching resistor 64 is approximately 5 nm. As an example, a clearance between the common wire 61 and the quenching resistor 64 is approximately 300 nm, and a clearance between the quenching resistor 64 and the common wire 63 is approximately 300 nm. A clearance between the common wire 63 and the main surface 44B of the semiconductor substrate 44 is approximately 300 nm. The insulating layer 66 is made of $SiO_2$ (silicon oxide). The insulating layer 66 covers the wires H1 to HN and the wires R1 to RM. As an example, the thickness of the insulating layer 66 is 2.5 μm.

In the photodetection device according to the second embodiment including the light receiving unit 40 as well, as in the photodetection device 1, the bias voltage is sequentially applied to each of the cell groups of the first to the N-th columns in accordance with a timing at which the reflected light is incident on each of the cell groups of the first to the N-th columns. In a state where the bias voltage is applied to any one of the cell groups of the first to the N-th columns, signals from the cells U of the first to the M-th rows included in the cell group to which the bias voltage is applied are read through the wires R1 to RM.

Figure 15:
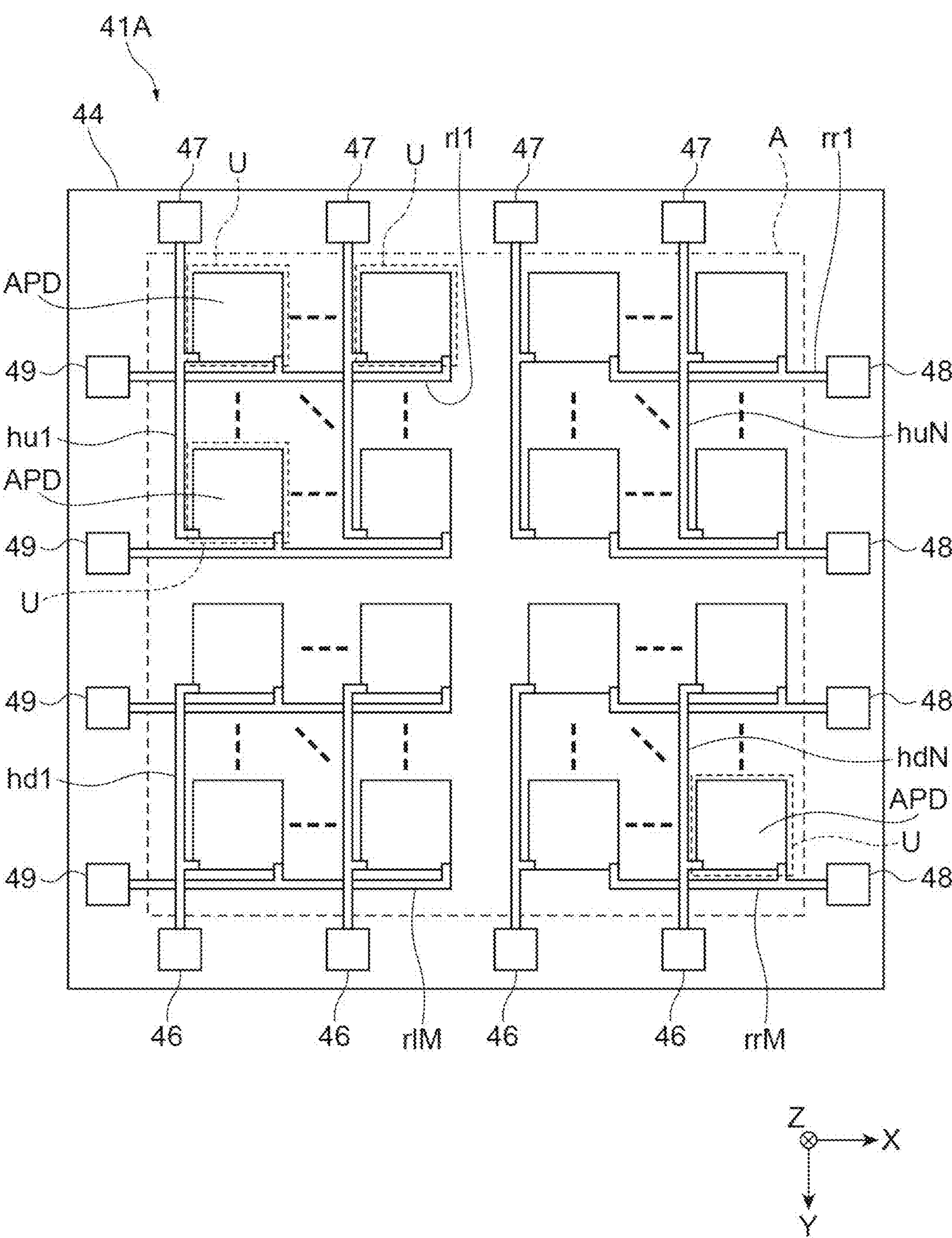
FIG. 15 is a schematic plan view of a semiconductor photodetection element according to a modification example.

A semiconductor photodetection element 41A according to a modification example in the photodetection device of the present embodiment will next be described. FIG. 15 is a schematic plan view of the semiconductor photodetection element according to the modification example. The semiconductor photodetection element 41A shown in FIG. 15 differs from the semiconductor photodetection element 11A shown in FIG. 8 in the following point. The wires H1 to HN and the wires R1 to RM are disposed on the main surface 44B close to the circuit board 42. These wires are electrically connected to the bump electrodes 46, the bump electrodes 47, the bump electrodes 48, and the bump electrodes 49.

In the semiconductor photodetection element 41A, as in the semiconductor photodetection element 11A, the wires H1 to HN include a plurality of branch wires hu1 to huN and a plurality of branch wires hd1 to hdN, and the wires R1 to RM include a plurality of branch wires rl1 to rlM and a plurality of branch wires rr1 to rrM. The branch wires hu1 to huN are electrically connected to the bump electrodes 47, and the branch wires hd1 to hdN are electrically connected to the bump electrodes 46. The branch wires rl1 to rlM are electrically connected to the bump electrodes 49, and the branch wires rr1 to rrM are electrically connected to the bump electrodes 48.

In the photodetection device according to the second embodiment including the semiconductor photodetection element 41, 41A as well, as in the photodetection device 1 including the semiconductor photodetection element 11, 11A, the configuration of the wires H1 to HN and the wires R1 to RM is simplified.

When the reflected light is incident on a cell U included in the cell group of the n-th column to which the bias voltage is applied, in the process of avalanche multiplication, another light that is different from the reflected light may be emitted from the cell U. In this case, the other light is incident on a cell U that is adjacent to the cell U emitting the other light, and thus optical crosstalk may occur. The optical crosstalk as described above can occur even when the other light is incident on a cell U which is adjacent thereto in the row direction and to which the bias voltage is not applied. Since in the semiconductor photodetection element 41, 41A, the light-shielding member 53 is provided within the trench 21, even if the other light is to be incident on the cell U adjacent thereto, the other light is shielded by the light-shielding member 53. Consequently, the optical crosstalk is reduced, and thus the detection accuracy in the photodetection device including the semiconductor photodetection element 41, 41A is enhanced.

The light-shielding member 53 is covered with the insulating film 54. Even when water or the like is to be adhered to the light-shielding member 53, the adherence thereof to the light-shielding member 53 is prevented by the insulating film 54, so that corrosion of the surface of the light-shielding member 53 is reduced. Consequently, the durability of the light-shielding member 53 is enhanced.

Figure 16:
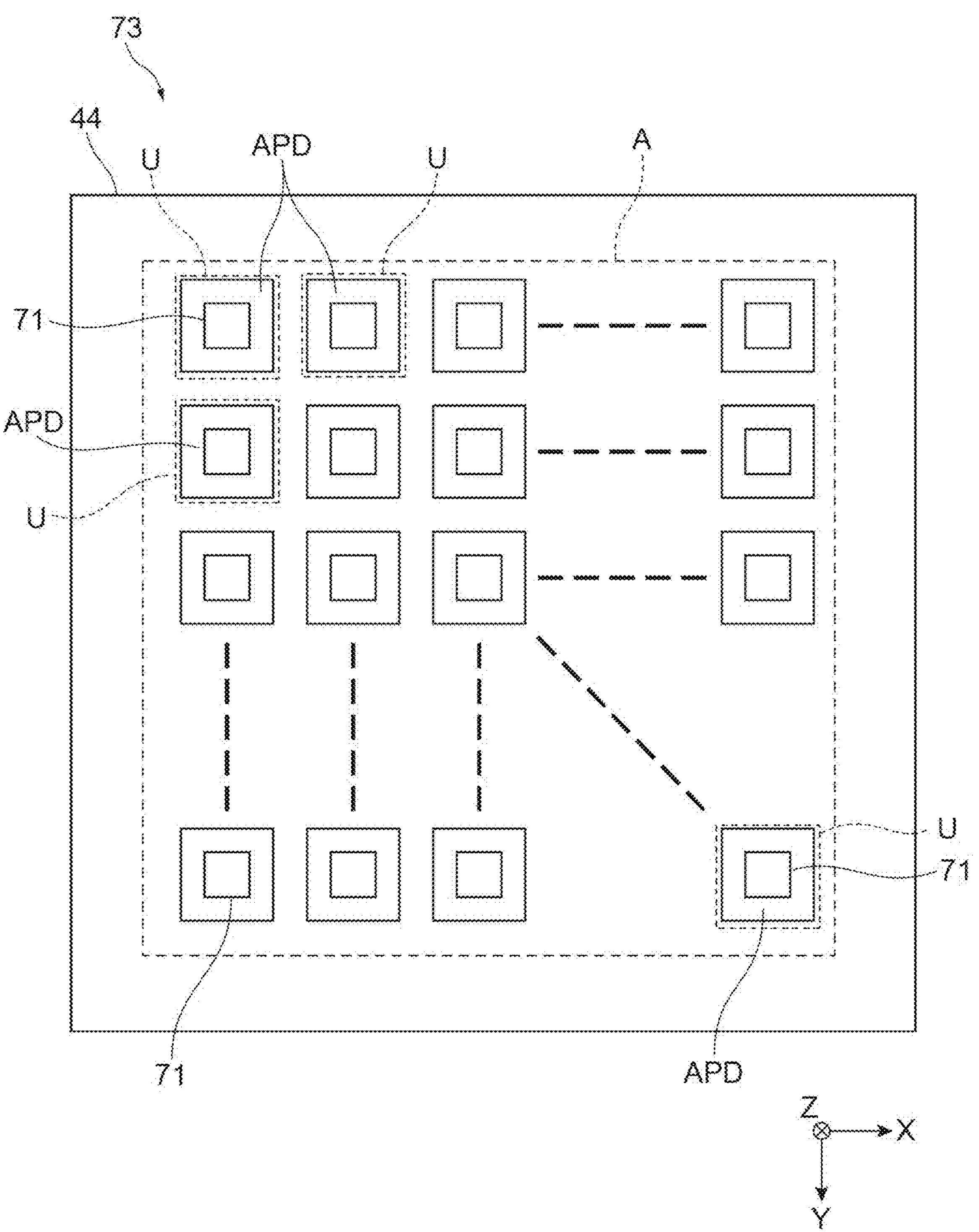
FIG. 16 is a schematic plan view of a semiconductor photodetection element included in a photodetection device according to a third embodiment.
Figure 17:
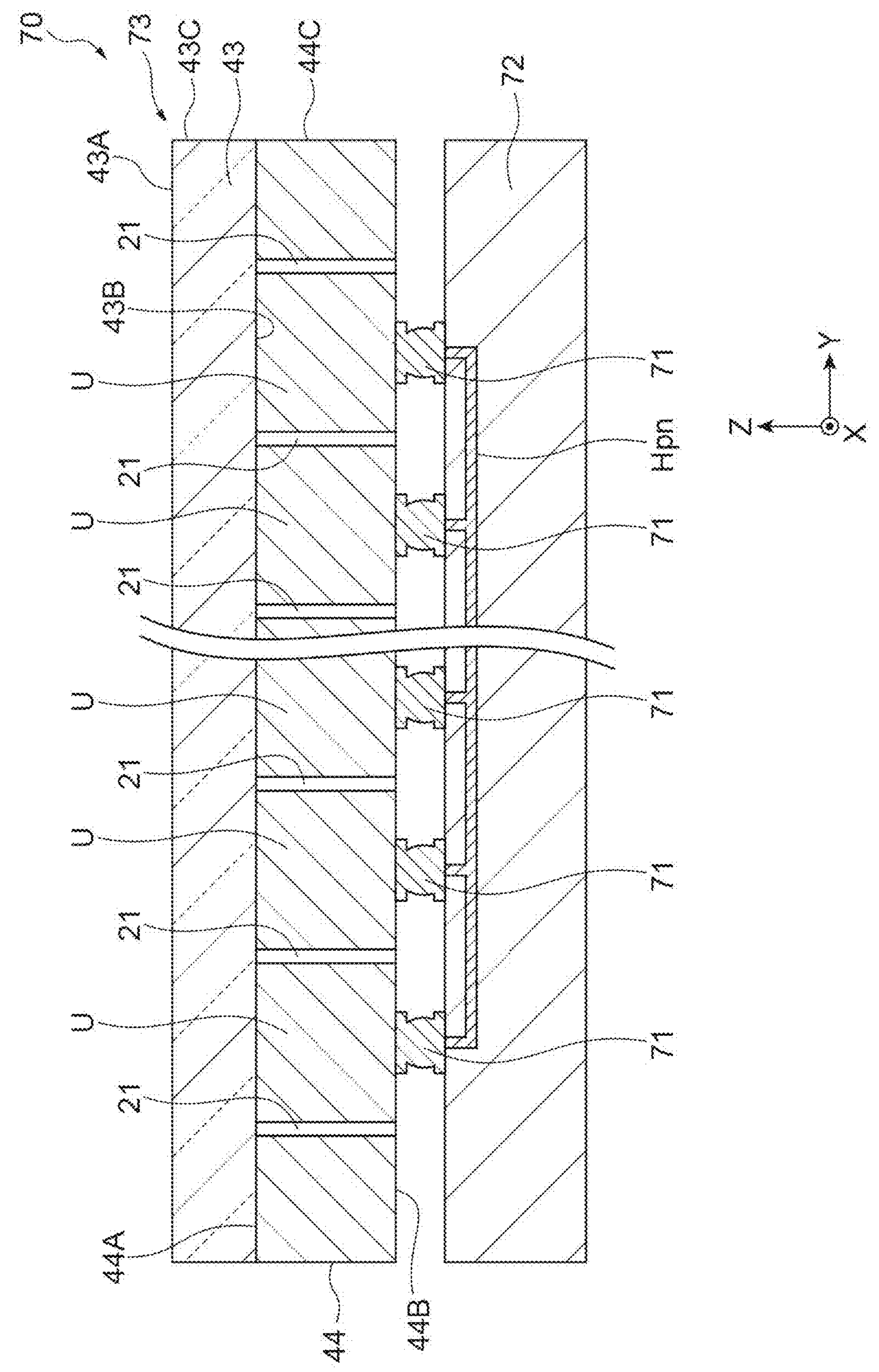
FIG. 17 is a schematic view showing a sectional configuration of a light receiving unit.
Figure 18:
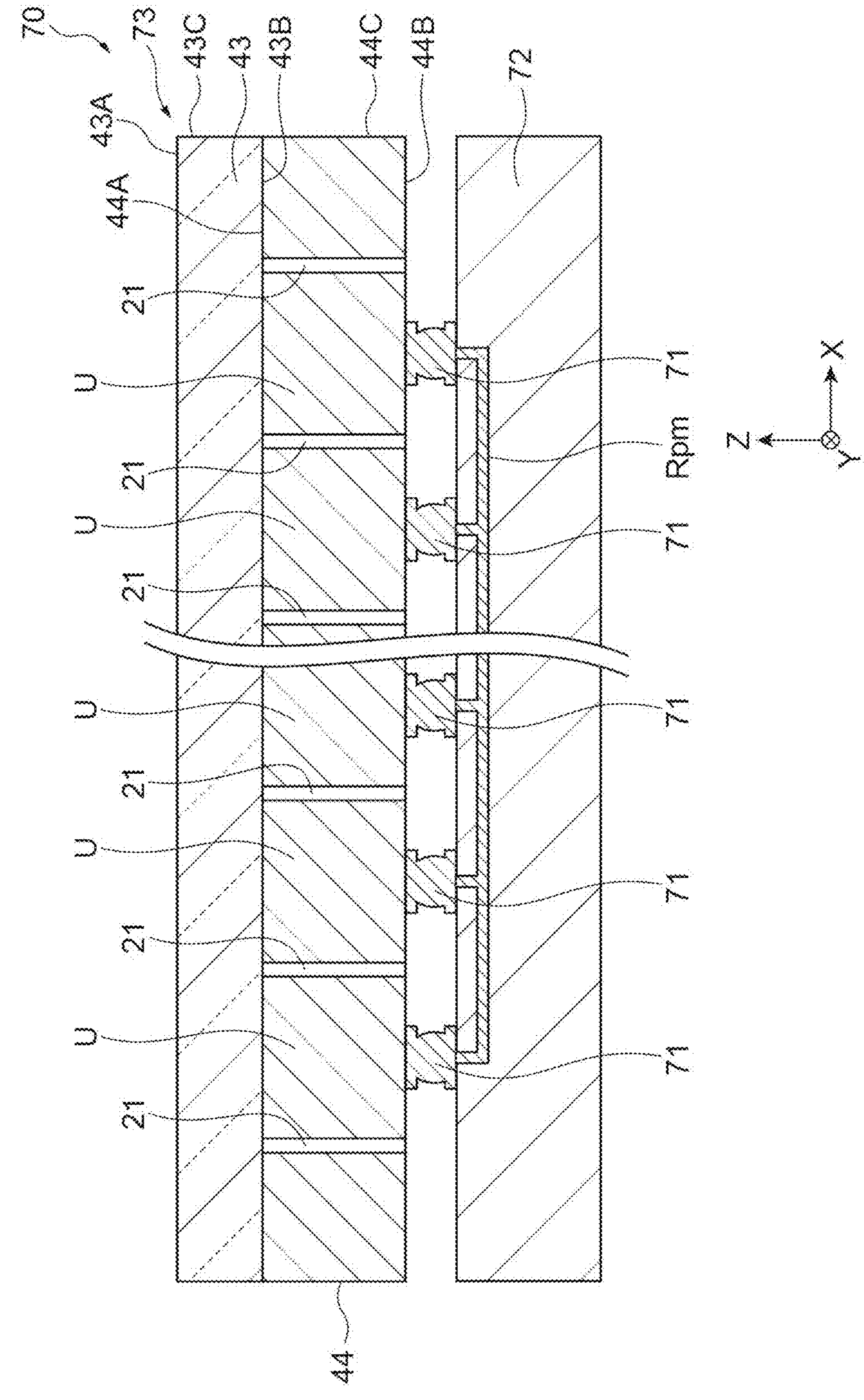
FIG. 18 is a schematic view showing a sectional configuration of the light receiving unit.

A light receiving unit 70 included in a photodetection device according to a third embodiment will next be described with reference to FIGS. 16 to 18. FIG. 16 is a schematic plan view of a semiconductor photodetection element included in the photodetection device according to the third embodiment. FIG. 17 is a schematic view showing a sectional configuration of the light receiving unit. FIG. 18 is a schematic view showing a sectional configuration of the light receiving unit.

The light receiving unit 70 shown in FIGS. 16 to 18 differs from the light receiving unit 40 shown in FIG. 10 in that the cells U are electrically connected to a circuit board 72 through a plurality of bump electrodes 71 in place of the wires H1 to HN and the wires R1 to RM. The light receiving unit 70 includes a semiconductor photodetection element 73 and the circuit board 72. The semiconductor photodetection element 73 includes a semiconductor substrate 44 and the bump electrodes 71. The bump electrodes 71 are respectively provided for each of the cells U arrayed two-dimensionally in M rows and N columns. The semiconductor photodetection element 73 is, for example, a semiconductor photodetection element of a backside incident type.

The circuit board 72 includes a switching section and a reading section. The switching section applies a bias voltage to each of the columns of the cell groups of the first to the N-th columns. The reading section includes reading circuits that read signals from the respective rows of the cell groups of the first to the M-th rows. For example, the switching section and the reading section included in the circuit board 72 form a controller. As shown in FIG. 17, the cells U included in the cell group of the n-th column are electrically connected to the switching section within the circuit board 72 through a wire Hpn provided within the circuit board 72. The "n" in the "wire Hpn" is an integer of 1 to N. The bias voltage is applied to the cell group of the n-th column through the wire Hpn within the circuit board 72. Within the circuit board 72, a plurality of wires Hp1 to HpN are respectively provided for each of the columns of the cell groups of the first to the N-th columns, and the wires Hp1 to HpN are electrically connected through the bump electrodes 71 to corresponding cell groups of the first to the N-th columns.

As shown in FIG. 18, the cells U included in the cell group of the m-th row are electrically connected to the reading section within the circuit board 72 through a wire Rpm provided within the circuit board 72. The "m" in the "wire Rpm" is an integer of 1 to M. Signals from the cells U included in the cell group of the m-th row are read through the wire Rpm. In the wire Rpm, a quenching resistor may be included. Within the circuit board 72, a plurality of wires Rp1 to RpM are respectively provided for each of the rows of the cell groups of the first to the M-th rows, and the wires Rp1 to RpM are electrically connected through the bump electrodes 71 to corresponding cell groups of the first to the M-th rows.

Unlike the semiconductor photodetection element 11, 41, the semiconductor photodetection element 73 does not include wires for applying the bias voltage to each of the columns of the cell groups of the first to the N-th columns or wires for reading the signals from each of the rows of the cell groups of the first to the M-th rows. In the light receiving unit 70, within the circuit board 72, the wires Hp1 to HpN for applying the bias voltage and the wires Rp1 to RpM for reading signals are provided. The wires Hp1 to HpN and the wires Rp1 to RpM may be provided on the surface of the circuit board 72. For example, the wires Hp1 to HpN form a plurality of first wires, and the wires Rp1 to RpM form a plurality of second wires.

In the photodetection device according to the third embodiment including the light receiving unit 70, the bias voltage is sequentially applied through the wires Hp1 to HpN within the circuit board 72 to each of the cell groups of the first to the N-th columns in accordance with a timing at which the reflected light is incident on each of the cell groups of the first to the N-th columns. In a state where the bias voltage is applied to any one of the cell groups of the first to the N-th columns, signals from the cells U of the first to the M-th rows included in the cell group to which the bias voltage is applied are read through the wires Rp1 to RpM within the circuit board 72.

In the photodetection device according to the third embodiment including the light receiving unit 70 as well, as in the photodetection device 1 including the semiconductor photodetection element 11, the configuration of the wires Hp1 to HpN and the wires Rp1 to RpM is simplified.

The light receiving unit 70 includes the circuit board 72 including the switching section and the reading section. Each of the cells U is electrically connected to the circuit board 72. The wires Hp1 to HpN and the wires Rp1 to RpM are provided in the circuit board 72. Hence, as compared with the light receiving unit 4, 40 in which the wires H1 to HN and the wires R1 to RM are disposed in the semiconductor substrate 20, 44, in the light receiving unit 70, a member (for example, the insulating layer 66) that protects the wires for applying the bias voltage and the wires for reading signals is not needed, with the result that the configuration of the light receiving unit 70 can be simplified.

Although embodiments and modification examples of the present invention have been described above, the present invention is not necessarily limited to the embodiments and the modification examples described above, and various modifications are possible without departing from the spirit thereof.

For example, in the cells U arrayed two-dimensionally in M rows and N columns, M and N may be respectively different numbers. Among the cells U arrayed two-dimensionally in M rows and N columns, a plurality of cells U located in a region of the light receiving region A may be used, and signals corresponding to the reflected light may be read. For example, the light projecting unit 2 may project the laser light such that the reflected light is incident on a plurality of cells U which are located in the first to the (M/2)th rows in the column direction and which are located in the first to the (N/2)th columns in the row direction, for each of the columns.

For example, the photodetection device may include a semiconductor photodetection element that has a plurality of cells U arrayed two-dimensionally in (2×M) rows and N columns. In this photodetection device, the light projecting unit 2 may scan the laser light such that the reflected light is incident on a plurality of cells U located in the first to the M-th rows and the first to the N-th columns for each of the columns, and may thereafter scan the laser light such that the reflected light is incident on a plurality of cells U located in the (M+1)th to the (2×M)th rows and the first to the N-th columns for each of the columns. For example, the light projecting unit 2 may scan the laser light along the direction D2 such that in each of the columns, the reflected light is incident on the cells U of the first to the M-th rows and is thereafter incident on the cells U of the (M+1)th to the (2×M)th rows. In these cases, for each of the columns, a single wire for applying the bias voltage to the cells U of the first to the (2×M)th rows may be provided, and for each of the columns, a wire for applying the bias voltage to the cells U of the first to the M-th rows and a wire for applying the bias voltage to the cells U of the (M+1)th to the (2×M)th rows may be provided.

The trench 21 that is formed to electrically separate the avalanche photodiodes APD within the cells U adjacent to each other may open in only one of the main surface 20A, 44A and the main surface 20B, 44B of the semiconductor substrate 20, 44. In this case, the length of the trench 21 in the Z axis direction may be equal to or greater than, for example, a half of the length of the semiconductor substrate 20, 44 in the Z axis direction. When in the semiconductor substrate 44, the trench 21 opens in only one of the main surface 44A and the main surface 44B, the light receiving unit 40 does not need to include the glass substrate 43. The trench 21 does not need to be formed in the semiconductor substrate 20, 44 to surround each of the cells U when viewed in the Z axis direction. For example, the trench 21 may be formed, in the semiconductor substrate 20, 44, in only positions that separate cell groups adjacent to each other therebetween among the cell groups of the first to the N-th columns. For example, the shape or the depth of the trench that separates cell groups adjacent to each other therebetween among the cell groups of the first to the N-th columns may be different from the shape or the depth of the trench that separates cell groups adjacent to each other therebetween among the cell groups of the first to the M-th rows.

Although in the embodiments described above, cell groups that are adjacent to each other among the cell groups of the first to the N-th columns are electrically separated by the trench 21, the configuration in which cell groups that are adjacent to each other are electrically separated is not limited to this configuration. For example, in place of the trench 21, cells U that are adjacent to each other among the cells U may be separated by a well. In other words, cell groups adjacent to each other among the cell groups of the first to the N-th columns may be separated by the well therebetween. For example, the well is a semiconductor region whose conductivity type is opposite to the conductivity type of the semiconductor region that forms the outer edge of the avalanche photodiodes APD. For example, the well is formed by adding an impurity into a silicon substrate by a diffusion method or an ion implantation method. When cells U that are adjacent to each other are separated by the well, the light-shielding member 53 cannot be disposed in the well, whereas when they are separated by the trench 21, the light-shielding member 53 can be disposed in the trench 21. Hence, as compared with a case where cells U that are adjacent to each other are separated by the well, when cells U adjacent to each other are separated by the trench 21, optical crosstalk can be reduced.

Although in the embodiments described above, an example of layer structure of the avalanche photodiode APD is indicated, the layer structure of the avalanche photodiode APD is not limited to this structure. For example, the conductivity type of the semiconductor region 51 may be p-type, and the conductivity types of the semiconductor region 55 and the semiconductor region 56 may be n-type. For example, the semiconductor region 51 may be formed of a plurality of semiconductor regions whose impurity concentrations are different from each other. The avalanche photodiode APD does not need to include the semiconductor region 56. For example, in each of the avalanche photodiodes APD, the semiconductor region of a first conductivity type may form one of the main surfaces of the semiconductor substrate, and the semiconductor region of a second conductivity type that forms a pn junction with the semiconductor region of the first conductivity type may form the other main surface of the semiconductor substrate. In this case, the wires H1 to HN and the wires R1 to RM may be respectively provided on different main surfaces. For example, the wires H1 to HN for applying the bias voltage may be electrically connected to the semiconductor region 51, and the wires R1 to RM for reading signals may be electrically connected to the semiconductor region 56. For example, the semiconductor region 51, 55, or 56 may be formed by adding an impurity into a silicon substrate by the diffusion method or the ion implantation method. The layer structures of the avalanche photodiode APD in the embodiments described above and the present modification example are examples, and the layer structure of the avalanche photodiode APD may be formed so as to operate in the Geiger mode by the application of the bias voltage. In the layer structures of the avalanche photodiode APD that are illustrated, a semiconductor region indicated by the n-type may be a p-type semiconductor region, and a semiconductor region indicated by the p-type may be an n-type semiconductor region. The semiconductor regions corresponding to the anode and the cathode differ in accordance with the layer structure of the avalanche photodiode APD.

The wires H1 to HN may be electrically connected to the cells U of the first to the M-th rows, and the wires R1 to RM may include the branch wires rl1 to rlM and the branch wires rr1 to rrM. The wires R1 to RM may be electrically connected to the cells U of the first to the N-th columns, and the wires H1 to HN may include the branch wires hu1 to huN and the branch wires hd1 to hdN. In other words, the configuration of a portion of the semiconductor photodetection element 11A, 41A may be applied to the semiconductor photodetection element 11, 41.

The controller that performs control to drive, for each of columns, the cell groups of the first to the N-th columns in the semiconductor photodetection element 11, 41 and to read, for each of rows, the output from the cell groups of the first to the M-th rows may be provided on a board different from the mounting board or the circuit board on which the semiconductor photodetection element 11, 41 is provided. The controller 13 may perform not only the control of the driving and reading described above but also control on the light projecting unit 2.

The wire Hn may include three or more branch wires. In this case, the cell group of the n-th column may be divided into the same number of groups as the number of branch wires, and the bias voltage may be applied to each of the groups through the branch wires. The wire Rm may include three or more branch wires. In this case, the cell group of the M-th row may be divided into the same number of groups as the number of branch wires, and signals may be read from each of the groups through the branch wires.

The light projecting unit 2 may project (scan) the laser light such that the reflected light of the laser light projected toward each of a plurality of light projection positions is incident on each plurality of cell groups among the cell groups of the first to the N-th columns. In this case, the number of each plurality of cell groups is less than N. In this case, the controller 13 may apply, in accordance with the incidence of the reflected light on each plurality of the cell groups, the bias voltage to each plurality of the cell groups. For example, the light projecting unit 2 may project the laser light such that the reflected light of the laser light projected toward each of (N/2) light projection positions is incident on cell groups of the (2×n−1)th column and the (2×n)th column among the cell groups of the first to the N-th columns. In this case, as in a case where the laser light is projected such that the reflected light of the laser light is incident on each of the cell groups of the first to the N-th columns, the wire for applying the bias voltage may be provided for each of the columns, and the wire for reading signals may be provided for each of the rows. Consequently, the configuration of the wire for applying the bias voltage to each of the avalanche photodiodes APD and the wire for reading signals from each of the cells U can be simplified. For example, the light projecting unit 2 may project the laser light such that in a plurality of cell groups on which the reflected light of the laser light projected toward one light projection position is incident, the number of cells aligned in the column direction is greater than the number of cells aligned in the row direction. In this case, while the resolution of the result of detection on the object using the photodetection device 1 is maintained, signals corresponding to the reflected light are efficiently read.

For example, the light projecting unit 2 may scan the laser light such that the reflected light of the laser light is incident on cell groups of the (2×n−1)th column and the (2×n)th column and is thereafter incident on cell groups of the (2×n)th column and the (2×n+1)th column. As described above, in a case where when the reflected light is incident on two cell groups corresponding to two columns, signals are read and an image is generated based on the read signals, it is possible to obtain the image with a high resolution. For example, as described above, when the laser light is scanned such that in the range in which the reflected light is incident, portions overlap each other, the reflected light may be incident on cell groups of three or more columns. For example, the light projecting unit 2 may project the laser light such that a plurality of reflected lights of the laser light beam differing mutually in position in the row direction are incident on each cell group or each plurality of cell groups. For example, when it is set such that the reflected light of the laser light is incident on each cell group or each plurality of cell groups, the mirrors 6 may be set to two different angles according to the one or plurality of cell groups. The mirrors 6 are set to two different angles according to the one cell group or the plurality of cell groups, and the laser light may be incident on two divided regions in the one cell group or the plurality of cell groups. For example, the mirrors 6 may be set to three or more different angles according to the one cell group or the plurality of cell groups. In this case, the laser light may be incident on three or more divided regions for the one cell group or the plurality of cell groups.

Although in the embodiments described above, the reading section 15 of the controller 13 reads a signal from each of the M cells U included in the cell group of the n-th column to which the bias voltage is applied, a method of reading signals is not limited to this method. The controller 13 may read signals from each plurality of cells among the M cells included in the cell group of the n-th column to which the bias voltage is applied. For example, the reading section 15 of the controller 13 may read a signal from cells U of the (2×m−1)th row and the (2×m)th row included in the cell group of the n-th column to which the bias voltage is applied. In this case, a wire that is electrically connected to the cell U of the (2×m−1)th row and a wire that is electrically connected to the cell U of the (2×m)th row may be connected to a single resistor 31, and a voltage drop in the resistor 31 may be input to the reading circuit 32. For example, when the reflected light is incident on one cell group or a plurality of cell groups, the plurality of laser light sources 5 included in the light projecting unit 2 may not only emit light at the same time but also emit light at different timings. In this case, timings at which the reflected light is incident on each of the cells U included in the cell group located in one column are inconsistent. Here, the bias voltage is applied to the M cells U included in the cell group located in the one column but timings at which signals are output respectively from the M cells U differ from each other. Hence, in the reading section 15, among the M cells U included in the cell group described above, a signal can be sequentially read from the cell on which the reflected light is incident. In this way, the number of rows (the number of cells U) that need to be read at the same time can be reduced, with the result that a circuit configuration located at a stage subsequent to the resistor 31 or the signal processing section 33 is simplified.

When the bias voltage is applied to the cell group of the n-th column, the switching section 14 of the controller 13 may apply a voltage lower than the bias voltage to the cell groups located in the columns other than the n-th column. The voltage applied to the cell groups located in the columns other than the n-th column is lower than a breakdown voltage. In other words, a voltage that does not make the avalanche photodiode APD operate in the Geiger mode may be applied to the avalanche photodiodes APD included in the cell groups located in the columns other than the n-th column. In this case as well, signals output from the avalanche photodiodes APD within the cells U to which the bias voltage is not applied are extremely small, and thus the influence of the signals exerted on the entire signals read through the wires R1 to RM is extremely small, with the result that the detection accuracy in the photodetection device 1 is enhanced. When the bias voltage is to be applied, the bias voltage that makes the avalanche photodiode APD operate in the Geiger mode is applied to the avalanche photodiode APD without causing a rapid change in voltage.

The wires R1 to RM do not need to include the quenching resistors 64. In this case, the reading section 15 of the controller 13 may include quenching resistors.

The column direction in which the cells U are arrayed and the direction D1 may be slightly displaced from each other. When the column direction and the direction D1 coincide with each other, the reflected light is easily incident on a necessary portion of the cells U, the reflected light is incident on only the necessary portion and the vicinity thereof and thus electric power (power) that is supplied to the laser light sources 5 is reduced.

Wires for electrically connecting the cells U included in the cell groups of the first to the N-th columns and wires for electrically connecting the cells U included in the cell groups of the first to the M-th rows are not limited to the wires H1 to HN and the wires R1 to RM that are made of a metal material. For example, in the cell groups in which the cells U are aligned in the column direction or in the cell groups in which the cells U are aligned in the row direction, wires for electrically connecting the cells U included in the cell groups may be semiconductor regions formed in the semiconductor substrate. In this case, the semiconductor regions corresponding to the anodes or the cathodes of the cells U may be electrically connected to each other by semiconductor regions (diffusion regions) for connection. By contrast, when the cells U included in the cell groups are electrically connected by the wires made of a metal material, as compared with the configuration in which they are electrically connected by the semiconductor regions for connection, a voltage drop caused by the wires is low, with the result that the cells U are connected to substantially the same potential. For example, when the semiconductor regions for connection described above are provided, one electrical contact (electrode) may be provided for the M cells U included in the cell group in which the cells U are aligned in the column direction, and one wire for applying the bias voltage to the cell group described above may be connected to the contact.

REFERENCE SIGNS LIST

20 light projecting unit
11, 11A, 41, 41A semiconductor photodetection element
13 controller
20, 44 semiconductor substrate
20A, 44A main surface
20B, 44B main surface
21 trench
U cell
APD avalanche photodiode
H1 to HN, Hn wire
R1 to RM, Rm wire
hu1 to huN, hd1 to hdN branch wire
rl1 to rlm, rr1 to rrM branch wire
S detection target region.

The invention claimed is:

1. A photodetection device comprising:

a light projecting unit that is arranged to project light toward a detection target region, the light having a cross-sectional shape whose longitudinal direction corresponds to a first direction;

a light receiving unit that includes a semiconductor substrate including a plurality of cells arrayed two-dimensionally in M rows and N columns (M and N are integers equal to or greater than 2) and that is arranged to receive reflected light of the light projected by the light projecting unit; and a controller that is connected to the light receiving unit, wherein each of the plurality of cells includes at least one avalanche photodiode arranged to operate in a Geiger mode, the plurality of cells includes N first cell groups each of which includes M cells aligned in a column direction, the light projecting unit is arranged to scan the light along a second direction intersecting the first direction such that the reflected light is incident on each first cell group or each plurality of first cell groups, the controller is arranged to apply one of a first voltage and a second voltage to each first cell group or each plurality of first cell groups, the first voltage being greater than a breakdown voltage of the avalanche photodiode, the second voltage being less than the breakdown voltage, and the controller is also arranged to:

start the application of the first voltage before a starting time at which the projection of the light toward a corresponding light projection position when applying the first voltage to each first cell group or each plurality of first cell groups in accordance with the incidence of the reflected light, and read signals from cells included in the first cell group or the plurality of first cell groups to which the first voltage has been applied.

2. The photodetection device according to claim 1, wherein the light projecting unit is arranged to scan the light along the second direction such that the reflected light is incident on each first cell group, and the controller is arranged to apply, in accordance with the incidence of the reflected light, the first voltage to each first cell group, and is arranged to read signals from the M cells included in the first cell group to which the first voltage has been applied.

3. The photodetection device according to claim 1, further comprising:

a plurality of first wires that are respectively provided for each first cell group; and a plurality of second wires, wherein the plurality of cells includes M second cell groups each of which includes N cells aligned in a row direction, the plurality of second wires are respectively provided for each second cell group, each of the first wires is electrically connected to first regions of the M cells included in a corresponding first cell group of the N first cell groups, a first region being one of an anode and a cathode of a cell, each of the second wires is electrically connected to second regions of the N cells included in a corresponding second cell group of the M second cell groups, a second region being the other of the anode and the cathode of the cell, and the controller is arranged to apply, through each of the first wires, the first voltage to the M cells included in the corresponding first cell group, and to read the signals through each of the second wires.

4. The photodetection device according to claim 2, further comprising:

a plurality of first wires that are respectively provided for each first cell group; and a plurality of second wires, wherein the plurality of cells includes M second cell groups each of which includes N cells aligned in a row direction, the plurality of second wires are respectively provided for each second cell group, each of the first wires is electrically connected to first regions of the M cells included in a corresponding first cell group of the N first cell groups, a first region being one of an anode and a cathode of a cell, each of the second wires is electrically connected to second regions of the N cells included in a corresponding second cell group of the M second cell groups, a second region being the other of the anode and the cathode of the cell, and the controller is arranged to apply, through each of the first wires, the first voltage to the M cells included in the corresponding first cell group, and to read the signals through each of the second wires.

5. The photodetection device according to claim 3, further comprising:

a circuit board that includes the controller, wherein each of the plurality of cells is electrically connected to the circuit board, and the plurality of first wires and the plurality of second wires are provided in the circuit board.

6. The photodetection device according to claim 1, wherein in the semiconductor substrate, a trench is formed to separate first cell groups that are adjacent to each other.

7. The photodetection device according to claim 2, wherein in the semiconductor substrate, a trench is formed to separate first cell groups that are adjacent to each other.

8. The photodetection device according to claim 3, wherein in the semiconductor substrate, a trench is formed to separate first cell groups that are adjacent to each other.

9. The photodetection device according to claim 4, wherein in the semiconductor substrate, a trench is formed to separate first cell groups that are adjacent to each other.

10. The photodetection device according to claim 5, wherein in the semiconductor substrate, a trench is formed to separate first cell groups that are adjacent to each other.

11. The photodetection device according to claim 1, wherein the semiconductor substrate includes:

a first main surface and a second main surface that oppose each other, and a trench configured to open in at least one of the first main surface and the second main surface, and configured to surround each of the plurality of cells when viewed in a direction orthogonal to the first main surface.

12. The photodetection device according to claim 2, wherein the semiconductor substrate includes:

a first main surface and a second main surface that oppose each other, and a trench configured to open in at least one of the first main surface and the second main surface, and configured to surround each of the plurality of cells when viewed in a direction orthogonal to the first main surface.

13. The photodetection device according to claim 3, wherein the semiconductor substrate includes:

a first main surface and a second main surface that oppose each other, and a trench configured to open in at least one of the first main surface and the second main surface, and configured to surround each of the plurality of cells when viewed in a direction orthogonal to the first main surface.

14. The photodetection device according to claim 4, wherein the semiconductor substrate includes:

a first main surface and a second main surface that oppose each other, and a trench configured to open in at least one of the first main surface and the second main surface, and configured to surround each of the plurality of cells when viewed in a direction orthogonal to the first main surface.

15. The photodetection device according to claim 5, wherein the semiconductor substrate includes:

a first main surface and a second main surface that oppose each other, and a trench configured to open in at least one of the first main surface and the second main surface, and configured to surround each of the plurality of cells when viewed in a direction orthogonal to the first main surface.

16. The photodetection device according to claim 1, wherein the controller is arranged to continue to apply the first voltage until a predetermined time elapses after a termination time at which the projection of the light is terminated when applying the first voltage to each first cell group or each plurality of first cell groups in accordance with the incidence of the reflected light.

17. The photodetection device according to claim 11, wherein the controller is arranged to continue to apply the first voltage until a predetermined time elapses after a termination time at which the projection of the light is terminated when applying the first voltage to each first cell group or each plurality of first cell groups in accordance with the incidence of the reflected light.

18. The photodetection device according to claim 1, wherein the controller is arranged to continue to apply the first voltage until a predetermined time elapses after a termination time at which the projection of the light is terminated when applying the first voltage to each first cell group or each plurality of first cell groups in accordance with the incidence of the reflected light, the predetermined time being longer than a time between the starting time and a second starting time at which the application of the first voltage is started.

19. The photodetection device according to claim 11, wherein the controller is arranged to continue to apply the first voltage until a predetermined time elapses after a termination time at which the projection of the light is terminated when applying the first voltage to each first cell group or each plurality of first cell groups in accordance with the incidence of the reflected light, the predetermined time being longer than a time between the starting time and a second starting time at which the application of the first voltage is started.

20. The photodetection device according to claim 3, further comprising:

a circuit board that includes the controller, wherein the semiconductor substrate and the circuit board are configured to overlap each other when viewed in a third direction that intersects both the first direction and the second direction, the reflected light being incident along the third direction.

21. The photodetection device according to claim 13, further comprising:

a circuit board that includes the controller, wherein the semiconductor substrate and the circuit board are configured to overlap each other when viewed in a third direction that intersects both the first direction and the second direction, the reflected light being incident along the third direction.

22. The photodetection device according to claim 4, further comprising:

a circuit board that includes the controller, wherein the semiconductor substrate and the circuit board are configured to overlap each other when viewed in a third direction that intersects both the first direction and the second direction, the reflected light being incident along the third direction.

23. The photodetection device according to claim 14, further comprising:

a circuit board that includes the controller, wherein the semiconductor substrate and the circuit board are configured to overlap each other when viewed in a third direction that intersects both the first direction and the second direction, the reflected light being incident along the third direction.

24. The photodetection device according to claim 4, further comprising:

a circuit board that includes the controller, wherein each of the plurality of cells is electrically connected to the circuit board, and the plurality of first wires and the plurality of second wires are provided in the circuit board.

25. The photodetection device according to claim 13, further comprising:

a circuit board that includes the controller, wherein each of the plurality of cells is electrically connected to the circuit board, and the plurality of first wires and the plurality of second wires are provided in the circuit board.

26. The photodetection device according to claim 14, further comprising:

a circuit board that includes the controller, wherein each of the plurality of cells is electrically connected to the circuit board, and the plurality of first wires and the plurality of second wires are provided in the circuit board.

27. A sensing device comprising:

a light projecting unit that is arranged to project light toward a detection target region;

a plurality of cells that are arranged to receive reflected light of the light projected by the light projecting unit, each of the plurality of cells including at least one avalanche photodiode; and a controller arranged to supply one of a first voltage and a second voltage to each of a plurality of cell groups which are obtained by dividing the plurality of cells, the first voltage being greater than a breakdown voltage of the avalanche photodiode, the second voltage being less than the breakdown voltage, wherein the controller is arranged to start the application of the first voltage before a starting time at which the projection of the light is started when applying the first voltage to a part of the plurality of cells.

28. The sensing device according to claim 27, wherein the controller is arranged to sequentially read signals from the plurality of cells by sequentially performing a switching control for each of the plurality of cell groups, the switching control includes:

supplying the first voltage to cells that belong to one of the plurality of cell groups, and supplying the second voltage to cells that belong to other of the plurality of cell groups.

29. The sensing device according to claim 27, further comprising:

a semiconductor substrate that includes the plurality of cells, and a circuit board that includes the controller, wherein each of the plurality of cells is electrically connected to the circuit board.

30. The sensing device according to claim 29, wherein the semiconductor substrate and the circuit board are configured to overlap each other when viewed in a direction, the reflected light being incident along the direction.

31. The sensing device according to claim 27, further comprising:

a semiconductor substrate that includes the plurality of cells, wherein the semiconductor substrate includes:

a first main surface and a second main surface that oppose each other, and a trench configured to open in at least one of the first main surface and the second main surface, and configured to surround each of the plurality of cells when viewed in a direction orthogonal to the first main surface.

32. The sensing device according to claim 27, wherein the controller is arranged to continue to apply the first voltage until a predetermined time elapses after a termination time at which the projection of the light is terminated when applying the first voltage to the part of the plurality of cells.

33. The sensing device according to claim 27, wherein the controller is arranged to continue to apply the first voltage until a predetermined time elapses after a termination time at which the projection of the light is terminated when applying the first voltage to the part of the plurality of cells, the predetermined time being longer than a time between the starting time and a second starting time at which the application of the first voltage is started.

34. A method of controlling a sensing device that includes a light projecting unit that is arranged to project light toward a detection target region and a plurality of cells that are arranged to receive reflected light of the light projected by the light projecting unit, each of the plurality of cells including at least one avalanche photodiode, the method comprising:

controlling to supply one of a first voltage and a second voltage to each of a plurality of cell groups which are obtained by dividing the plurality of cells, the first voltage being greater than a breakdown voltage of the avalanche photodiode, the second voltage being less than the breakdown voltage, wherein controlling to supply one of the first voltage and the second voltage to each of the plurality of cell groups includes starting the application of the first voltage before a starting time at which the projection of the light is started when applying the first voltage to a part of the plurality of cells.

35. The method according to claim 34, wherein controlling to supply one of the first voltage and the second voltage to each of the plurality of cell groups includes continuing to apply the first voltage until a predetermined time elapses after a termination time at which the projection of the light is terminated when applying the first voltage to the part of the plurality of cells.

36. The method according to claim 34, wherein controlling to supply one of the first voltage and the second voltage to each of the plurality of cell groups includes continuing to apply the first voltage until a predetermined time elapses after a termination time at which the projection of the light is terminated when applying the first voltage to the part of the plurality of cells, the predetermined time being longer than a time between the starting time and a second starting time at which the application of the first voltage is started.

* * * * *